US012598853B2

(12) United States Patent
Lee et al.

(10) Patent No.: US 12,598,853 B2
(45) Date of Patent: Apr. 7, 2026

(54) WIRING SUBSTRATE AND DISPLAY DEVICE INCLUDING THE SAME

(71) Applicant: Samsung Display Co., LTD., Yongin-si (KR)

(72) Inventors: Dong Min Lee, Anyang-si (KR); Hyun Ah Sung, Suwon-si (KR); Tae Wook Kang, Seongnam-si (KR); Young Rok Kim, Anyang-si (KR); Kyu Soon Park, Yongin-si (KR); Joon Yong Park, Gunpo-si (KR); Hyun Eok Shin, Gwacheon-si (KR); Jong Hyun Choung, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 644 days.

(21) Appl. No.: 18/085,686

(22) Filed: Dec. 21, 2022

(65) Prior Publication Data

US 2023/0307487 A1      Sep. 28, 2023

(30) Foreign Application Priority Data

Mar. 11, 2022      (KR) ........................ 10-2022-0030528

(51) Int. Cl.
| | |
|---|---|
| *H10H 29/14* | (2025.01) |
| *H10H 20/821* | (2025.01) |
| *H10H 20/84* | (2025.01) |

(52) U.S. Cl.
CPC ........ *H10H 29/142* (2025.01); *H10H 20/821* (2025.01); *H10H 20/84* (2025.01)

(58) Field of Classification Search
CPC .... H10H 29/142; H10H 20/821; H10H 20/84; H10H 20/857; H01L 25/167;
(Continued)

(56) References Cited

U.S. PATENT DOCUMENTS

| | | | | |
|---|---|---|---|---|
| 9,728,521 B2 * | 8/2017 | Tsai | ........................ | H01L 24/08 |
| 11,152,317 B2 * | 10/2021 | Choi | ..................... | H01L 25/167 |

(Continued)

FOREIGN PATENT DOCUMENTS

| | | | | |
|---|---|---|---|---|
| EP | 3 499 579 | 6/2019 | | |
| JP | 2022118877 A * | 8/2022 | ........... | H01L 23/544 |

(Continued)

OTHER PUBLICATIONS

Extended European Search Report for European Application No. 23161345.6, dated Aug. 21, 2023.

*Primary Examiner* — Earl N Taylor

(74) *Attorney, Agent, or Firm* — Sughrue Mion, PLLC

(57) ABSTRACT

A display device includes a display area and a pad area on a side of the display area, a plurality of conductive layers on a first substrate in the display area and the pad area and comprising a wiring and a conductive pattern, a via layer on the plurality of conductive layers, a plurality of electrodes on the via layer in the display area and spaced apart from each other, and a light emitting element on at least one of the plurality of electrodes. At least one of the conductive layers includes a first metal layer, a second metal layer on the first metal layer, and a third metal layer on the second metal layer. The second metal layer includes copper (Cu), the third metal layer includes a copper alloy, and a grain size of the third metal layer is smaller than a grain size of the second metal layer.

22 Claims, 30 Drawing Sheets

(58) Field of Classification Search
CPC ..... H01L 25/0753; H01L 33/62; H01L 33/24;
H01L 33/44; H01L 27/156; H10D 86/60;
H10D 86/443; H10D 86/441; H10D
86/451
See application file for complete search history.

(56) References Cited

U.S. PATENT DOCUMENTS

| | | | |
|---|---|---|---|
| 11,908,739 B2 * | 2/2024 | Uzoh | .................. H01L 21/7684 |
| 12,136,602 B2 | 11/2024 | Choi et al. | |
| 12,211,809 B2 * | 1/2025 | Uzoh | ...................... H01L 24/80 |
| 2017/0025381 A1 * | 1/2017 | Tsai | .................. H01L 21/76877 |
| 2017/0162612 A1 | 6/2017 | Yao et al. | |
| 2018/0083211 A1 | 3/2018 | Lee et al. | |
| 2020/0098711 A1 * | 3/2020 | Choi | ........................ H01L 24/73 |
| 2021/0242138 A1 * | 8/2021 | Sawanobori | ...... H01L 23/49822 |
| 2021/0265322 A1 | 8/2021 | Jeon et al. | |
| 2021/0300000 A1 * | 9/2021 | Hashimoto | ............. B32B 15/20 |
| 2022/0406817 A1 * | 12/2022 | Park | ....................... H10H 20/84 |
| 2025/0022823 A1 | 1/2025 | Choi et al. | |

FOREIGN PATENT DOCUMENTS

| | | | |
|---|---|---|---|
| KR | 10-2007-0036948 | 4/2007 | |
| KR | 10-2020-0034078 A | 3/2020 | |
| KR | 10-2020-0143628 | 12/2020 | |
| KR | 102355341 B1 * | 1/2022 | .............. C25D 5/12 |

* cited by examiner

RME: RME1, RME2
CNE: CNE1, CNE2

T1: ACT1, G1, D1, S1

T1: ACT1, G1, D1, S1

10_2

DPA                                                   PDA

PAD

PAD_L  PAD_U    PDC

VIA          CDP1                VL1

PAS3
PV1                                                                 PAS2
                                                                    PAS1
                                                                    PV1
IL1                  S1        D1

101                                                                 IL1
GI                                                                  PW2
BL                                                                  BL
                                                                    PW1

B

SUB                                                                 SUB

ML1    ML2   G1    BML  ACT1              ML1   ML2   ML3

DR3

T1: ACT1, G1, D1, S1

RME: RME1, RME2, RME3, RME4
CNE: CNE1, CNE2, CNE3, CNE4, CNE5
ED: ED1, ED2, ED3, ED4

DR3

RME: RME1, RME2, RME3, RME4
CNE: CNE1, CNE2, CNE3, CNE4

RME: RME1, RME2
CNE: CNE1, CNE2, CNE3
ED: ED1, ED2

RME: RME1, RME2
CNE: CNE1, CNE2, CNE3
ED: ED1, ED2

WIRING SUBSTRATE AND DISPLAY DEVICE INCLUDING THE SAME

CROSS REFERENCE TO RELATED APPLICATION(S)

This application claims priority to and benefits of Korean Patent Application No. 10-2022-0030528 under 35 U.S.C. 119 filed on Mar. 11, 2022, in the Korean Intellectual Property Office (KIPO), and all the benefits accruing therefrom, the contents of which are incorporated by reference in its entirety.

BACKGROUND

1. Technical Field

The disclosure relates to a wiring substrate and a display device including the same.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image, there is a self-luminous display device including a light emitting element. The self-luminous display device may include an organic light emitting display using an organic material as a light emitting material for a light emitting element or an inorganic light emitting display using an inorganic material as a light emitting material.

SUMMARY

Aspects of the disclosure provide a wiring substrate in which wirings have a smooth surface and improved straightness and a display device including the wiring substrate.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a display area and a pad area disposed on a side of the display area, a plurality of conductive layers disposed on a first substrate in the display area and the pad area and including a wiring and a conductive pattern, a via layer disposed on the plurality of conductive layers, a plurality of electrodes disposed on the via layer in the display area and spaced apart from each other, and a light emitting element disposed on at least one of the plurality of electrodes. At least one of the plurality of conductive layers may include a first metal layer, a second metal layer disposed on the first metal layer, and a third metal layer disposed on the second metal layer. The second metal layer may include copper (Cu), the third metal layer may include a copper alloy, and a grain size of the third metal layer may be smaller than a grain size of the second metal layer.

The third metal layer may include a main component including copper and an impurity metal including at least one of silver (Ag), magnesium (Mg), aluminum (Al), indium (In), niobium (Nb), and boron (B).

The first metal layer may include titanium (Ti), and the second metal layer may include pure copper (Cu).

The grain size of the third metal layer may be a quarter or less of the grain size of the second metal layer.

A thickness of the third metal layer may be smaller than a thickness of the second metal layer.

The thickness of the third metal layer may be about 100 Å or more.

A thickness of the first metal layer may be in a range of about 200 Å to about 500 Å, and the thickness of the second metal layer may be in a range of about 3000 Å to about 17000 Å.

Each of the wiring and the conductive pattern may include the first metal layer, the second metal layer and the third metal layer, and a line edge roughness (LER) value of each of the wiring and the conductive pattern is about 0.195 μm or less.

The plurality of conductive layers may include a first conductive layer including a bottom metal layer disposed in the display area and a first pad wiring disposed in the pad area, a second conductive layer disposed on the first conductive layer and including a plurality of gate electrodes disposed in the display area and a second pad wiring disposed in the pad area, and a third conductive layer disposed on the second conductive layer and including a first conductive pattern disposed in the display area and a pad electrode lower layer disposed in the pad area. The via layer may be disposed on the third conductive layer in the display area. The display device may further include a pad electrode upper layer disposed on the pad electrode lower layer in the pad area and a pad electrode capping layer disposed on the pad electrode upper layer.

The display device may further include a gate insulating layer disposed between the first conductive layer and the second conductive layer, a first interlayer insulating layer disposed between the second conductive layer and the third conductive layer, and a first passivation layer disposed on the third conductive layer. Each of the gate insulating layer, the first interlayer insulating layer, and the first passivation layer may include an inorganic insulating material.

The plurality of conductive layers may further include a fourth conductive layer disposed on the third conductive layer and including a first voltage wiring and a second voltage wiring. The display device may further include a second interlayer insulating layer disposed on the first passivation layer and a second passivation layer disposed on the fourth conductive layer.

The via layer may include a trench portion exposing a portion of an upper surface of the second passivation layer. The plurality of electrodes may include a first electrode and a second electrode spaced apart from the first electrode. At least a portion of each of the first electrode and the second electrode may be directly disposed on the second passivation layer in the trench portion. The light emitting element may be disposed in the trench portion.

The plurality of electrodes may include a first electrode and a second electrode spaced apart from the first electrode. The display device may further include a first insulating layer disposed on the first electrode and the second electrode, a first connection electrode disposed on the first electrode and electrically contacting the light emitting element, and a second connection electrode disposed on the second electrode and electrically contacting the light emitting element.

The pad electrode upper layer, the first electrode, and the second electrode may include a same material, and the pad electrode capping layer, the first connection electrode, and the second connection electrode may include a same material.

The light emitting element may be disposed on the first insulating layer.

According to an embodiment of the disclosure, a wiring substrate may include a plurality of conductive layers disposed on a substrate and including a wiring and a conductive pattern, and at least one insulating layer disposed between adjacent ones of the plurality of conductive layers. At least one of the plurality of conductive layers may include a first metal layer, a second metal layer disposed on the first metal layer, and a third metal layer disposed on the second metal layer. The second metal layer may include copper (Cu), the third metal layer may include a copper alloy, and a grain size of the third metal layer may be smaller than a grain size of the second metal layer.

The first metal layer may include titanium (Ti), the second metal layer may include pure copper (Cu), and the third metal layer may include a main component including copper and an impurity metal including at least one of silver (Ag), magnesium (Mg), aluminum (Al), indium (In), niobium (Nb), and boron (B).

The grain size of the third metal layer may be a quarter or less of the grain size of the second metal layer.

The first metal layer may have a thickness in a range of about 200 Å to about 500 Å, the second metal layer may have a thickness in a range of about 3000 Å to about 17000 Å, and the third metal layer may have a thickness of about 100 Å or more.

Each of the wiring and the conductive pattern may include the first metal layer, the second metal layer and the third metal layer, and a line edge roughness (LER) value of each of the wiring and the conductive pattern may be about 0.195 μm or less.

The wiring substrate may further include a display area and a pad area disposed adjacent to the display area. The plurality of conductive layers may include a first conductive layer comprising a bottom metal layer disposed in the display area and a first pad wiring disposed in the pad area, a second conductive layer disposed on the first conductive layer and including a plurality of gate electrodes disposed in the display area and a second pad wiring disposed in the pad area, and a third conductive layer disposed on the second conductive layer and including a first conductive pattern disposed in the display area and a pad electrode lower layer disposed in the pad area The wiring substrate may further include a buffer layer disposed on the first conductive layer, a gate insulating layer disposed between the buffer layer and the second conductive layer in the display area, an interlayer insulating layer disposed between the second conductive layer and the third conductive layer, and a first passivation layer disposed on the third conductive layer. Each of the gate insulating layer, the interlayer insulating layer, and the first passivation layer may include an inorganic insulating material, and the second pad wiring may be directly disposed on the buffer layer.

In a wiring substrate according to an embodiment, each of the wiring and the conductive pattern may have a smooth surface and improved straightness by including a metal capping layer including a copper alloy and having a small grain size.

In a display device including the above wiring substrate according to an embodiment, a step coverage defect of an insulating layer disposed between the plurality of conductive layers can be reduced, and short circuit and burnt defects between wirings can be prevented.

The effects of the disclosure are not limited to the aforementioned effects, and various other effects are included in the specification.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
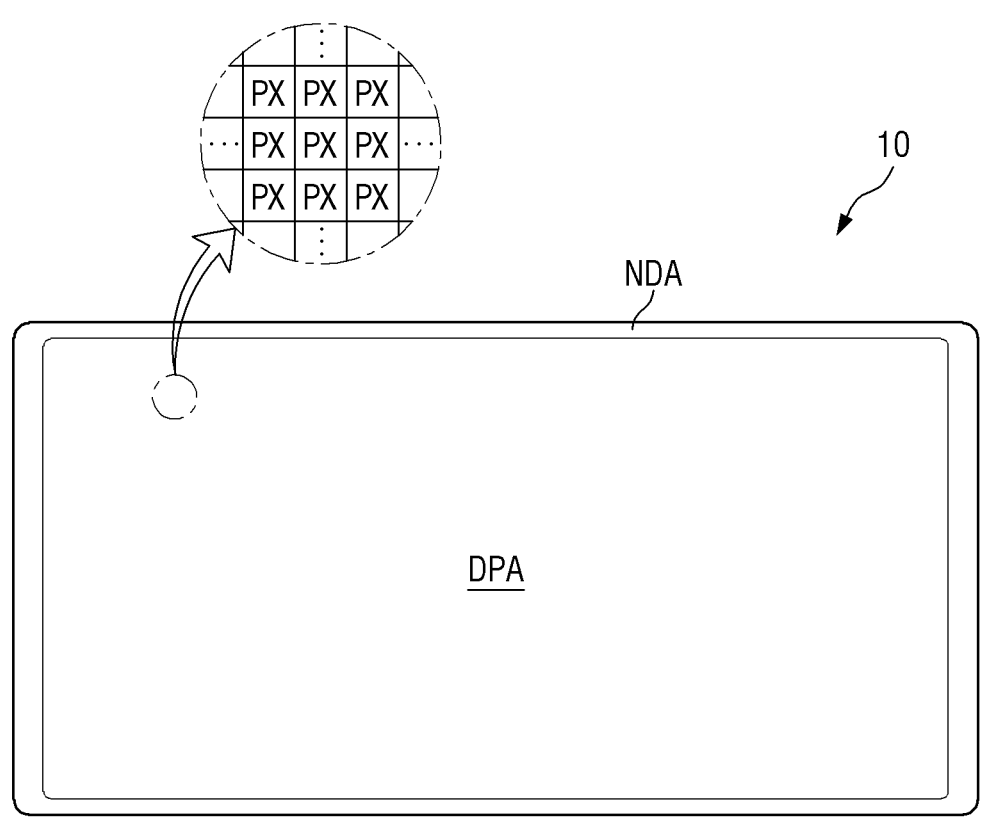
FIG. 1 is a schematic plan view of a display device according to an embodiment.
Figure 1:
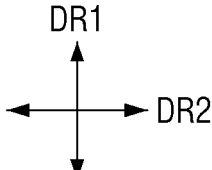

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

The terms "above," "top" and "top surface" as used herein refer to an upward direction (i.e., a Z-axis direction) with respect to the display device. The terms "below," "bottom" and "bottom surface" as used herein refer to a downward direction (i.e., a direction opposite to the Z-axis direction) with respect to the display device. Further, the terms "left," "right," "upper," and "lower" respectively indicate corresponding directions on the surface of the display device. For example, the term "left" indicates a direction opposite to an X-axis direction, the term "right" indicates the X-axis direction, the term "upper" indicates a Y-axis direction, and the term "lower" indicates a direction opposite to the Y-axis direction.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B."

Although the terms "first", "second", etc. may be used herein to describe various types of elements, these elements should not be limited by these terms. These terms are used to distinguish one element from another element. Thus, a first element discussed below could be termed a second element without departing from the teachings of the disclosure.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic plan view of a display device 10 according to an embodiment.

Referring to FIG. 1, the display device 10 may display moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, and camcorders, all of which provide a display screen.

The display device 10 may include a display panel that provides a display screen Examples of the display panel may include inorganic light emitting diode display panels, organic light emitting display panels, quantum dot light emitting display panels, plasma display panels, and field emission display panels. A case where an inorganic light emitting diode display panel is applied as an embodiment of the display panel will be described below, but the disclosure is not limited to this case, and other display panels may also be applied as long as the same technical spirit is applicable.

The shape of the display device 10 may be variously modified. For example, the display device 10 may have various shapes such as a horizontally long rectangle, a vertically long rectangle, a square, a quadrilateral with rounded corners (vertices), other polygons, or a circle. The shape of a display area DPA of the display device 10 may also be similar to the overall shape of the display device 10. In FIG. 1, the display device 10 with a rectangle shape that is long in a second direction DR2 is illustrated.

The display device 10 may include a display area DPA and a non-display area NDA. The display area DPA may be an area where an image may be displayed, and the non-display area NDA may be an area where no image may be displayed. The display area DPA may also be referred to as an active area, and the non-display area NDA may also be referred to as an inactive area. The display area DPA may generally occupy a center of the display device 10.

The display area DPA may include multiple pixels PX. The pixels PX may be arranged in a matrix. Each of the pixels PX may be rectangular or square in a plan view. However, the disclosure is not limited thereto, and each of the pixels PX may have a rhombic shape having each side inclined with respect to a direction. The pixels PX may be alternately arranged in a stripe or an island type. Each of the pixels PX may include one or more light emitting elements which emit light of a specific wavelength band to display a specific color.

The non-display area NDA may be located adjacent to the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be located, or external devices may be mounted.

Figure 2:
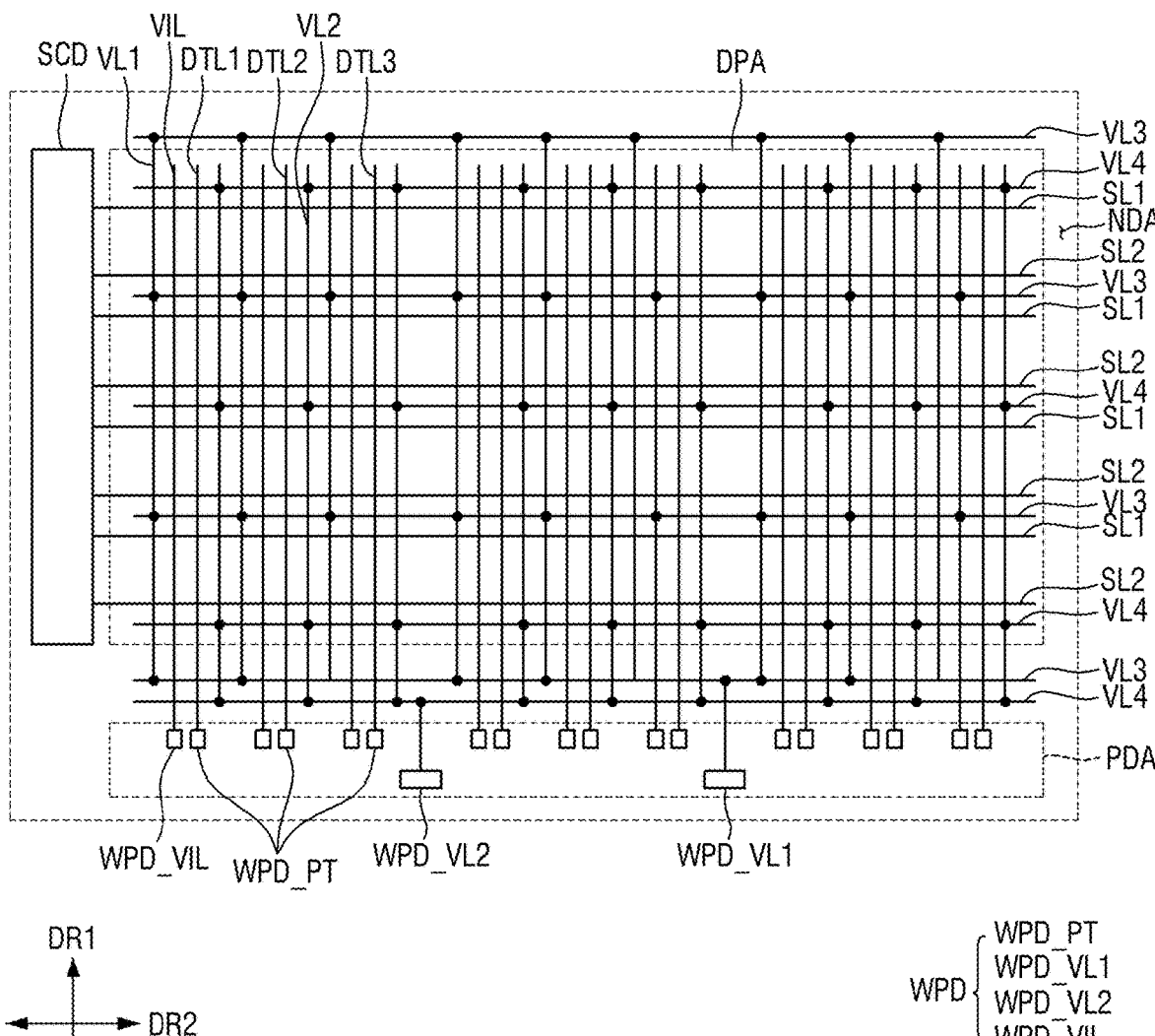
FIG. 2 is a plan view illustrating an arrangement of multiple wirings included in the display device according to an embodiment.

FIG. 2 is a plan view illustrating an arrangement of multiple wirings included in the display device 10 according to an embodiment.

Referring to FIG. 2, the display device 10 may include multiple wirings. The display device 10 may include multiple scan lines SL1 and SL2, multiple data lines DTL1 through DTL3, initialization voltage wirings VIL, and multiple voltage wirings VL (VL1 through VL4). Although not illustrated in the drawing, other wirings may be further disposed in the display device 10. The wirings may include wirings made of a first conductive layer and extending in a first direction DR1 and wirings made of a third conductive layer and extending in the second direction DR2. However, the directions in which the wirings extend are not limited thereto.

First scan lines SL1 and second scan lines SL2 may extend in the second direction DR2. A first scan line SL1 and a second scan line SL2 in a pair may be spaced apart from each other in the first direction DR1 and may be repeatedly arranged in the first direction DR1. The first scan lines SL1 and the second scan lines SL2 may be electrically connected to a scan driver SCD disposed on a side of the display area DPA in the second direction DR2. The first scan lines SL1 and the second scan lines SL2 may extend from the scan driver SCD from the non-display area NDA to cross the display area DPA in the second direction DR2.

The data lines DTL may extend in the first direction DR1. The data lines DTL may include first data lines DTL1, second data lines DTL2, and third data lines DTL3. One of the each first through third data lines DTL1 through DTL3 may form one group. The first through third data lines DTL1 through DTL3 may be spaced apart from each other in the second direction DR2, and other wirings may be disposed between them. Each of the data lines DTL1 through DTL3 may extend from a pad area PDA disposed in the non-display area NDA to the display area DPA.

The initialization voltage wirings VIL may extend in the first direction DR1. Each of the initialization voltage wirings VII may be disposed between one of the data lines DTL and a first voltage wiring VL1. The initialization voltage wirings VII may extend in the first direction DR1 from the pad area PDA disposed in the non-display area NDA to the display area DPA.

First voltage wirings VL1 and second voltage wirings VL2 may extend in the first direction DR1, and third voltage wirings VL3 and fourth voltage wirings VL4 may extend in the second direction DR2. The first voltage wirings VL1 and the second voltage wirings VL2 may be alternately disposed in the second direction DR2, and the third voltage wirings VL3 and the fourth voltage wirings VL4 may be alternately disposed in the first direction DR1. The first voltage wirings VL1 and the second voltage wirings VL2 may extend in the first direction DR1 across the display area DPA. Among the third voltage wirings VL3 and the fourth voltage wirings VL4, some wirings may be disposed in the display area DPA, and other wirings may be disposed in the non-display area NDA located on both sides of the display area DPA in the first direction DR1. The first voltage wirings VL1 and the second voltage wirings VL2 may be in the first conductive layer, and the third voltage wirings VL3 and the fourth voltage wirings VL4 may be in the third conductive layer disposed on a different layer from the first conductive layer. Each of the first voltage wirings VL1 may be electrically connected to at least one third voltage wiring VL3, and each of the second voltage wirings VL2 may be electrically connected to at least one fourth voltage wiring VL4. The voltage wirings VL may have a mesh structure in the entire display area DPA. However, the disclosure is not limited thereto.

The data lines DTL, the initialization voltage wirings VIL, the first voltage wirings VL1, and the second voltage wirings VL2 may be electrically connected to at least one wiring pad WPD. Each wiring pad WPD may be disposed in the non-display area NDA. In an embodiment, each wiring pad WPD may be disposed in the pad area PDA located on a lower side of the display area DPA which is a second side in the first direction DR1. The data lines DTL may be electrically connected to different data wiring pads WPD_DT, respectively. Each of the initialization voltage wirings VIL may be electrically connected to an initialization wiring pad WPD_Vint, the first voltage wirings VL1 may be electrically connected to a first voltage wiring pad WPD_VL1, and the second voltage wirings VL2 may be electrically connected to a second voltage wiring pad WPD_VL2. An external device may be mounted on the wiring pads WPD (or in the pad area PDA). The external device may be mounted on the wiring pads WPD (or in the pad area PDA) through an anisotropic conductive film, ultrasonic bonding, or the like. Although each wiring pad WPD is disposed in the pad area PDA located on the lower side of the display area DPA in the drawing, the disclosure is not limited thereto. Some of the wiring pads WPD may also be disposed in an area located on an upper side or one of left and right sides of the display area DPA.

Each pixel PX or subpixel SPXn (where n is an integer of 1 to 3) of the display device 10 may include a pixel driving circuit. The above-described wirings may pass through or adjacent to each pixel PX and may transmit a driving signal to each pixel driving circuit. The pixel driving circuit may include a transistor and a capacitor. The number of transistors and capacitors in each pixel driving circuit may be variously changed. According to an embodiment, each subpixel SPXn of the display device 10 may have a 3T1C structure in which the pixel driving circuit includes three transistors and one capacitor. Although the pixel driving circuit will be described below using the 3T1C structure as an embodiment, the disclosure is not limited thereto, and other various modified structures such as a 2T1C structure, a 7T1C structure, and a 6T1C structure may be also applicable.

Figure 3:
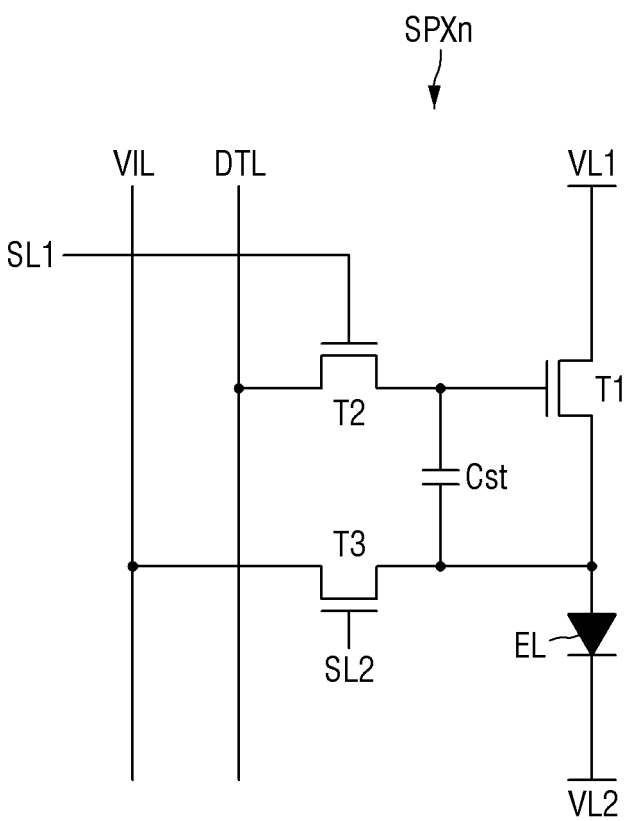
FIG. 3 is a schematic diagram of an equivalent circuit of a subpixel of the display device according to an embodiment.

FIG. 3 is a schematic diagram of an equivalent circuit of a subpixel SPXn disposed in the display device 10 according to an embodiment.

Referring to FIG. 3, each subpixel SPXn of the display device 10 according to the embodiment may include three transistors T1 through T3 and one storage capacitor Cst in addition to a light emitting diode EL.

The light emitting diode EL may emit light in response to a current supplied through a first transistor T1. The light emitting diode EL may include a first electrode, a second electrode, and at least one light emitting element disposed between them. The light emitting element may emit light of a specific wavelength band in response to electrical signals received from the first electrode and the second electrode.

A first end of the light emitting diode EL may be electrically connected to a source electrode of the first transistor T1, and a second end of the light emitting diode EL may be electrically connected to a second voltage wiring VL2 to which a low potential voltage (hereinafter, referred to as a second power supply voltage) lower than a high potential voltage (hereinafter, referred to as a first power supply voltage) of a first voltage wiring VL1 is supplied.

The first transistor T1 may adjust a current flowing from the first voltage wiring VL1, to which the first power supply voltage is supplied, to the light emitting diode EL based on a voltage difference between a gate electrode and the source electrode. For example, the first transistor T1 may be a driving transistor for driving the light emitting diode EL. The first transistor T1 may have the gate electrode electrically connected to a source electrode of a second transistor T2, the source electrode electrically connected to the first electrode of the light emitting diode EL, and a drain electrode electrically connected to the first voltage wiring VL1 to which the first power supply voltage is applied.

The second transistor T2 may be turned on by a scan signal of a first scan line SL1 to electrically connect a data line DTL to the gate electrode of the first transistor T1. The second transistor T2 may have a gate electrode electrically connected to the first scan line SL1, the source electrode electrically connected to the gate electrode of the first transistor T1, and a drain electrode electrically connected to the data line DTL.

A third transistor T3 may be turned on by a scan signal of a second scan line SL2 to electrically connect an initialization voltage wiring VIL to the first end of the light emitting diode EL. The third transistor T3 may have a gate electrode electrically connected to the second scan line SL2, a drain electrode electrically connected to the initialization voltage wiring VIL, and a source electrode electrically connected to the first electrode of the light emitting diode EL or the source electrode of the first transistor T1.

The source electrode and the drain electrode of each of the transistors T1 through T3 are not limited to the above description, and the opposite may also be applied. Each of the transistors T1 through T3 may be formed as a thin-film transistor. Although each of the transistors T1 through T3 is described as an N-type metal oxide semiconductor field effect transistor (MOSFET) in FIG. 3, the disclosure is not limited thereto. For example, each of the transistors T1 through T3 may be formed as a P-type MOSFET, or some of the transistors T1 through T3 may be formed as N-type MOSFETs, and the other may be formed as a P-type MOSFET.

The storage capacitor Cst may be formed between the gate electrode and the source electrode of the first transistor T. The storage capacitor Cst may store a difference between a gate voltage and a source voltage of the first transistor T.

In the embodiment of FIG. 3, the gate electrode of the second transistor T2 may be electrically connected to the first scan line SL1, and the gate electrode of the third transistor T3 may be electrically connected to the second scan line SL2. The first scan line SL1 and the second scan line SL2 may be different scan lines, and the second transistor T2 and the third transistor T3 may be turned on by scan signals transmitted from different scan lines. However, the disclosure is not limited thereto.

In some embodiments, the gate electrodes of the second transistor T2 and the third transistor T3 may be electrically connected to a same scan line SL. The second transistor T2 and the third transistor T3 may be simultaneously turned on by a scan signal applied from the same scan line.

The structure of a pixel PX of the display device 10 according to the embodiment will now be described in detail with further reference to other drawings.

Figure 4:
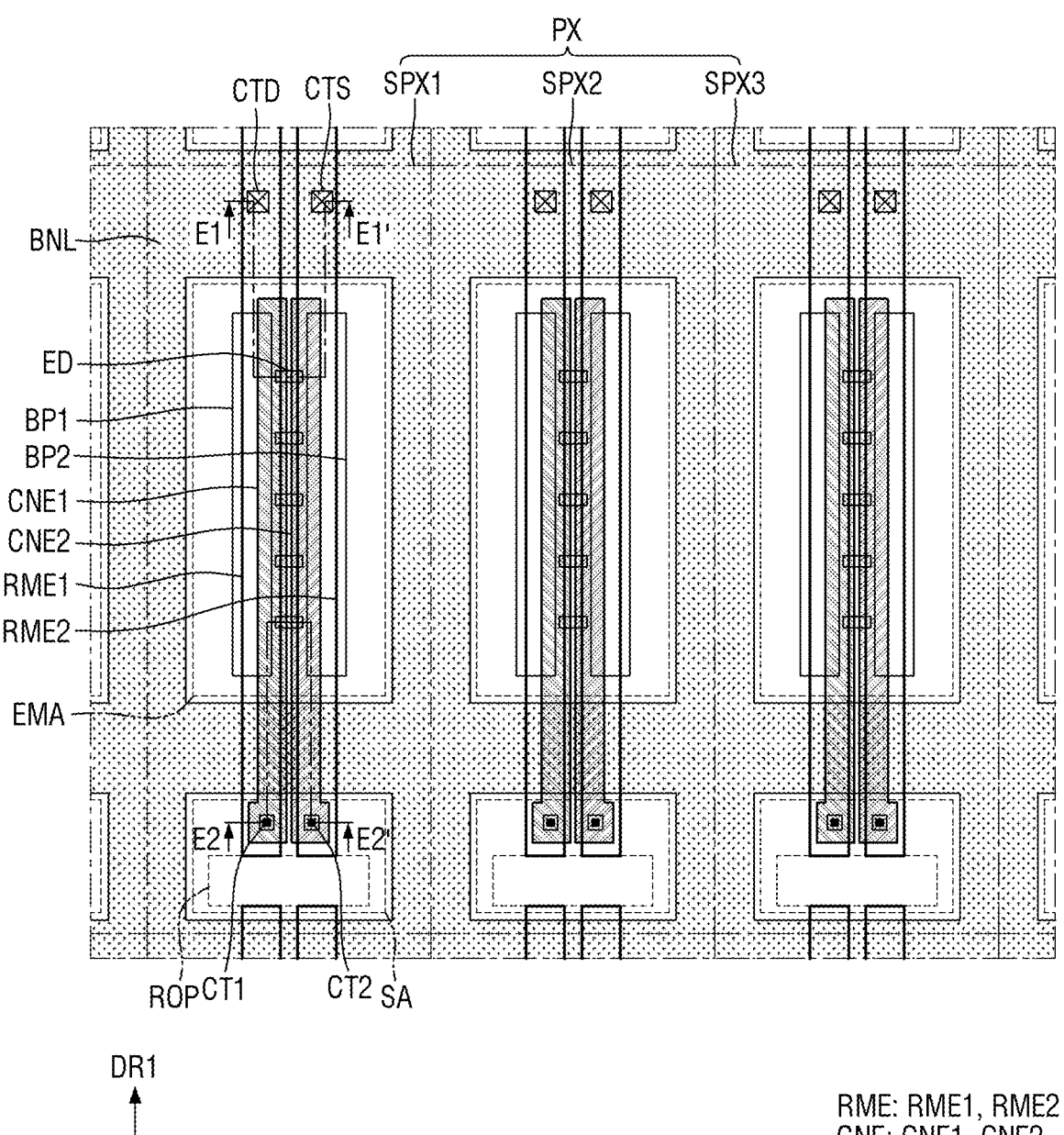
FIG. 4 is a plan view of a pixel of the display device according to an embodiment.

FIG. 4 is a plan view of a pixel PX of the display device 10 according to an embodiment.

FIG. 4 illustrates a planar arrangement of electrodes RME (RME1 and RME2), barrier walls BP1 and BP2, a bank layer BNL, multiple light emitting elements ED, and connection electrodes CNE (CNE1 and CNE2) in a pixel PX of the display device 10.

Referring to FIG. 4, each of the pixels PX of the display device 10 may include multiple subpixels SPXn. For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the disclosure is not limited thereto, and the subpixels SPXn may emit light of the same color. In an embodiment, the subpixels SPXn may emit blue light. Although a pixel PX includes three subpixels SPXn in the drawing, the disclosure is not limited thereto, and the pixel PX may include a greater number of subpixels SPXn.

Each subpixel SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may include an area in which the light emitting elements ED are disposed and an area which is adjacent to the light emitting elements ED and from which light emitted from the light emitting elements ED is output. For example, the emission area EMA may include an area from which light emitted from the light emitting elements ED is output after being reflected or refracted by other members. Multiple light emitting elements ED may be disposed in each subpixel SPXn, and an area where the light emitting elements ED are located and an area adjacent to this area may form the emission area EMA.

Although the respective emission areas EMA of the subpixels SPXn have substantially the same area in the drawing, the disclosure is not limited thereto. In some embodiments, the emission area EMA of each subpixel SPXn may have a different area according to the color or wavelength band of light emitted from the light emitting elements ED disposed in the subpixel SPXn.

Each subpixel SPXn may further include a sub-area SA disposed in the non-emission area. The sub-area SA of each subpixel SPXn may be disposed on a lower side of the emission area EMA which is the second side in the first direction DR1. The emission area EMA and the sub-area SA may be alternately arranged in the first direction DR1, and the sub-area SA may be disposed between the emission areas EMA of adjacent subpixels SPXn spaced apart from each other in the first direction DR1. For example, the emission area EMA and the sub-area SA may be alternately arranged in the first direction DR1 and may each be repeatedly arranged in the second direction DR2. However, the disclosure is not limited thereto, and the arrangement of the emission areas EMA and the sub-areas SA in multiple pixels PX may be different from that in FIG. 4.

Light may not exit from the sub-area SA because the light emitting elements ED are not disposed in the sub-area SA, and a portion of each of the electrodes RME disposed in each subpixel SPXn may be disposed in the sub-area SA. The electrodes RME disposed in adjacent subpixels SPXn in the first direction DR1 may be separated from each other by a separation portion ROP of the sub-area SA.

The display device 10 according to the embodiment may include the electrodes RME (RME1 and RME2), the barrier walls BP1 and BP2, the bank layer BNL, the light emitting elements ED, and the connection electrodes CNE (CNE1 and CNE2).

The barrier walls BP1 and BP2 may be disposed in the emission area EMA of each subpixel SPXn. The barrier walls BP1 and BP2 may generally extend in the first direction DR1 and may be spaced apart from each other in the second direction DR2.

For example, the barrier walls BP1 and BP2 may include a first barrier wall BP1 and a second barrier wall BP2 spaced apart from each other in the second direction DR2 in the emission area EMA of each subpixel SPXn. The first barrier wall BP1 may be disposed on a left side of a center of the emission area EMA which is a first side in the second direction DR2, and the second barrier wall BP2 may be spaced apart from the first barrier wall BP1 and disposed on a right side of the center of the emission area EMA which is a second side in the second direction DR2. The first barrier wall BP1 and the second barrier wall BP2 may be alternately arranged in the second direction DR2 and may be disposed as island-shaped patterns in the display area DPA. Multiple light emitting elements ED may be disposed between the first barrier wall BP1 and the second barrier wall BP2.

The first barrier wall BP1 and the second barrier wall BP2 may have the same length in the first direction DR1 and the lengths of the barrier walls BP1 and BP may be shorter in the first direction DR1 than a length of the emission area EMA in the first direction DR1 surrounded by the bank layer BNL. The first barrier wall BP1 and the second barrier wall BP2 may be spaced apart from portions of the bank layer BNL which extend in the second direction DR2. However, the disclosure is not limited thereto, and the barrier walls BP1 and BP2 may also be integrated with the bank layer BNL or may partially overlap the portions of the bank layer BNL which extend in the second direction DR2. The length of each of the barrier walls BP1 and BP2 in the first direction DR1 may be equal to or greater than the length, in the first direction DR1, of the emission area EMA surrounded by the bank layer BNL.

Although two barrier walls BP1 and BP2 are disposed in each subpixel SPXn in the drawing, the disclosure is not limited thereto. The number and shape of the barrier walls BP1 and BP2 may vary according to the number or arrangement structure of the electrodes RME.

The electrodes RME (RME1 and RME2) may extend in a direction and may be disposed in each subpixel SPXn. The electrodes RME1 and RME2 may extend in the first direction DR1 across the emission area EMA and the sub-area SA of each subpixel SPXn and may be spaced apart from each other in the second direction DR2. The electrodes RME may be electrically connected to the light emitting elements ED to be described later. However, the disclosure is not limited thereto, and the electrodes RME may not be directly connected to the light emitting elements ED.

The display device 10 may include a first electrode RME1 and a second electrode RME2 disposed in each subpixel SPXn. The first electrode RME1 may be disposed on the left side of the center of the emission area EMA, and the second electrode RME2 is spaced apart from the first electrode RME1 in the second direction DR2 and disposed on the right side of the center of the emission area EMA. The first electrode RME1 may be disposed on the first barrier wall BP1, and the second electrode RME2 may be disposed on the second barrier wall BP2. The first electrode RME1 and the second electrode RME2 may extend beyond the bank layer BNL to lie in a corresponding subpixel SPXn and a portion of the sub-area SA. The first electrodes RME1 and the second electrodes RME2 of adjacent subpixels SPXn in the first direction DR1 may be spaced apart or separated from each other by the separation portion ROP located in the sub-area SA of a subpixel SPXn.

Although two electrodes RME extend in the first direction DR1 in each subpixel SPXn in the drawing, the disclosure is not limited thereto. For example, in the display device 10, a greater number of the electrodes RME may be disposed in a subpixel SPXn, or the electrodes RME may be partially bent and may have a different width according to position.

The bank layer BNL may surround the subpixels SPXn, the emission areas EMA, and the sub-areas SA. The bank layer BNL may be disposed at boundaries between adjacent subpixels SPXn in the first direction DR1 and the second direction DR2 and also may be disposed at boundaries between the emission areas EMA and the sub-areas SA. The subpixels SPXn, the emission areas EMA, and the sub-areas SA of the display device 10 may be areas separated by the bank layer BNL. Distances between the subpixels SPXn, the emission areas EMA, and the sub-areas SA may vary according to a width of the bank layer BNL.

The bank layer BNL may include portions extending in the first direction DR1 and the second direction DR2 in a plan view to form a grid pattern in the entire display area DPA. The bank layer BNL may be disposed at the boundary of each subpixel SPXn to separate neighboring subpixels SPXn. The bank layer BNL may surround the emission area EMA and the sub-area SA disposed in each subpixel SPXn to separate them from each other. As will be described later, the bank layer BNL may also form an area where color control structures of the display device 10 are disposed.

The light emitting elements ED may be disposed in the emission area EMA. The light emitting elements ED may be disposed between the barrier walls BP1 and BP2 and may be spaced apart from each other in the first direction DR1. In an embodiment, the light emitting elements ED may extend in a direction, and both ends thereof may be disposed on different electrodes RME, respectively. A length of each light emitting element ED may be greater than a distance between the electrodes RME spaced apart in the second direction DR2. The direction in which the light emitting elements ED extend may be substantially perpendicular to the first direction DR1 in which the electrodes RME extend. However, the disclosure is not limited thereto, and the direction in which the light emitting elements ED extend may be the first direction DR1 or a direction oblique to the second direction DR2.

The connection electrodes CNE (CNE1 and CNE2) may be disposed on the electrodes RME and/or the barrier walls BP1 and BP2. The connection electrodes CNE may extend in a direction and may be spaced apart from each other. Each of the connection electrodes CNE may electrically contact the light emitting elements ED and may be electrically connected to an electrode RME or a conductive layer under the electrode RME.

The connection electrodes CNE may include a first connection electrode CNE1 and a second connection electrode CNE2 disposed in each subpixel SPXn. The first connection electrode CNE1 may extend in the first direction DR1 and may be disposed on the first electrode RME1 or the first barrier wall BP1. The first connection electrode CNE1 may partially overlap the first electrode RME1 and may extend from the emission area EMA to the sub-area SA through the bank layer BNL. The second connection electrode CNE2 may extend in the first direction DR1 and may be disposed on the second electrode RME2 or the second barrier wall BP2. The second connection electrode CNE2 may partially overlap the second electrode RME2 and may extend from the emission area EMA to the sub-area SA through the bank layer BNL.

Figure 5:
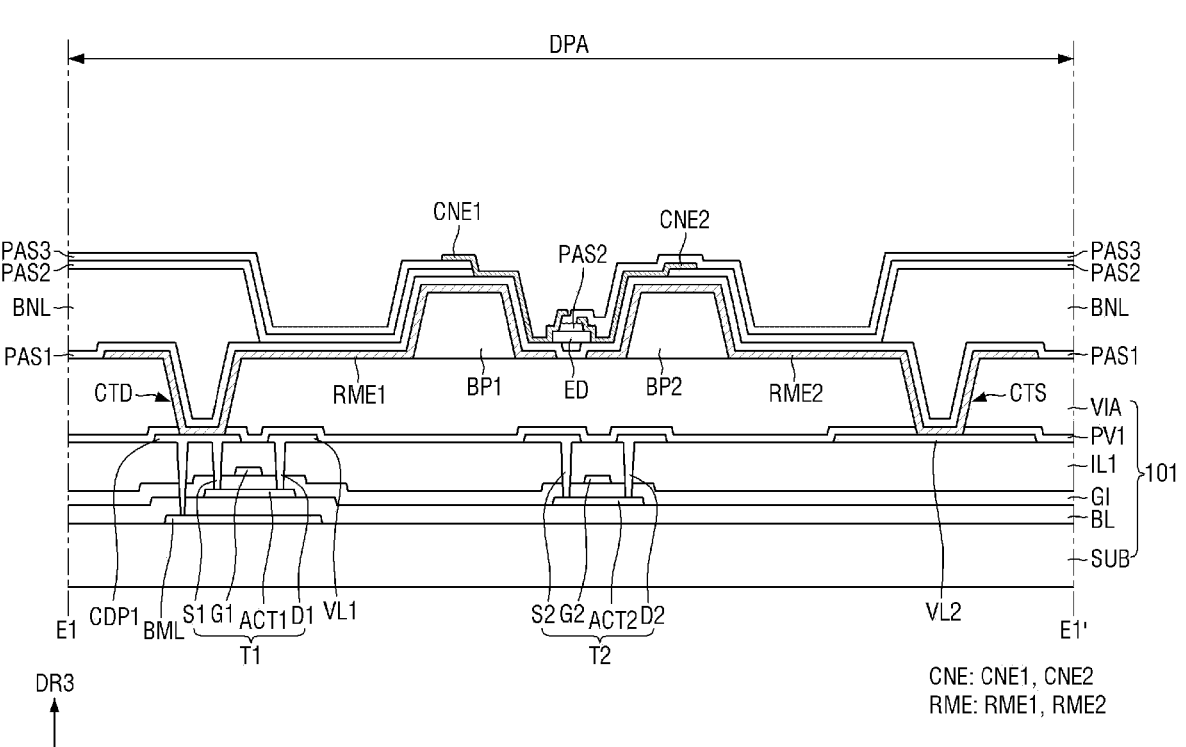
FIG. 5 is a schematic cross-sectional view taken along line E1-E1' of FIG. 4.
Figure 6:
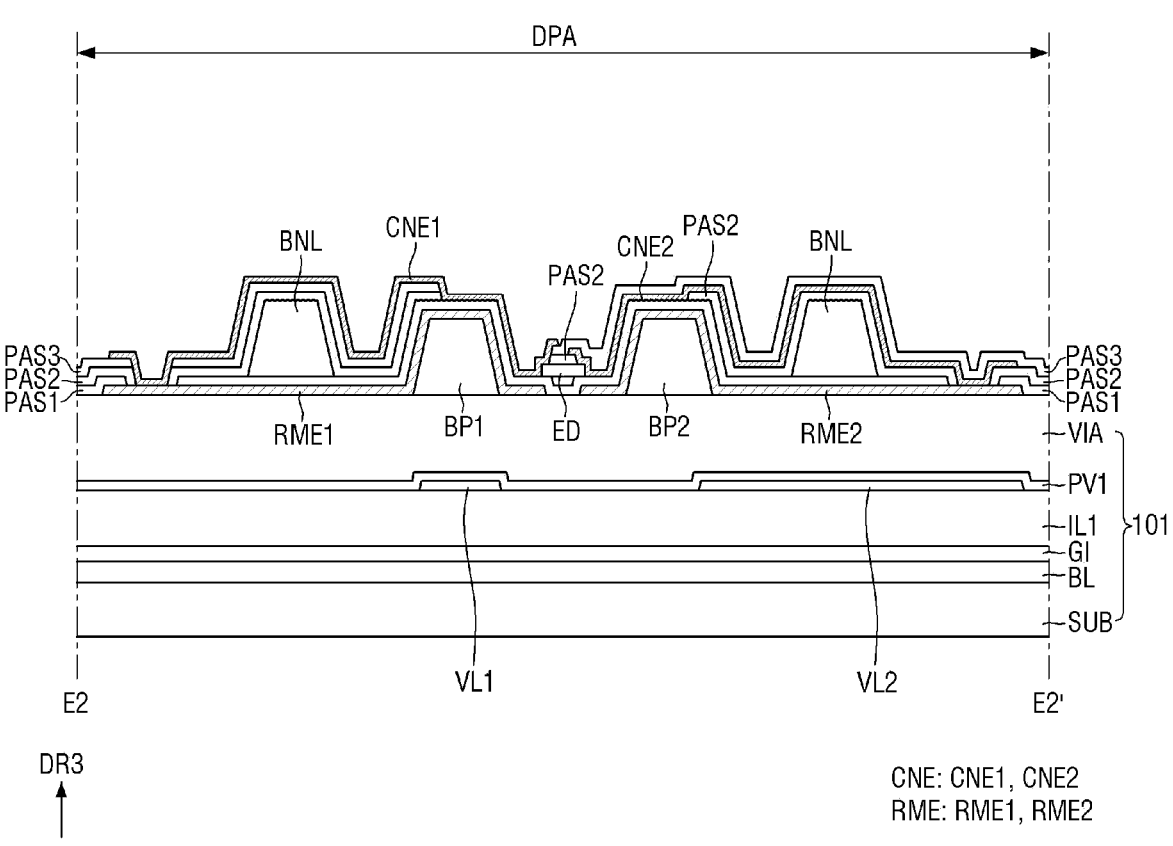
FIG. 6 is a schematic cross-sectional view taken along line E2-E2' of FIG. 4.

FIG. 5 is a schematic cross-sectional view taken along line E1-E1' of FIG. 4. FIG. 6 is a schematic cross-sectional view taken along line E2-E2' of FIG. 4.

FIG. 5 illustrates a cross section across both ends of a light emitting element ED and electrode contact holes CTD and CTS disposed in the first subpixel SPX1. FIG. 6 illustrates a cross section across both ends of a light emitting element ED and contact portions CT1 and CT2 disposed in the first subpixel SPX1.

Referring to FIGS. 5 and 6 in conjunction with FIG. 4, the display device 10 may include a wiring substrate 101 including a first substrate SUB and a semiconductor layer, multiple conductive layers and multiple insulating layers disposed on the first substrate SUB. The display device 10 may include the electrodes RME (RME1 and RME2), the light emitting elements ED, and the connection electrodes CNE (CNE1 and CNE2) disposed on the wiring substrate 101. The semiconductor layer, the conductive layers, and the insulating layers of the wiring substrate 101 may constitute a circuit layer of the display device 10.

The first substrate SUB may bean insulating substrate. The first substrate SUB may be made of an insulating material such as glass, quartz, or polymer resin. The first substrate SUB may be a rigid substrate, or may be a flexible substrate that may be bent, folded, rolled, etc. The first substrate SUB may include the display area DPA and the non-display area NDA adjacent to the display area DPA, and the display area DPA may include the emission area EMA and the sub-area SA which is a part of the non-emission area.

A first conductive layer may be disposed on the first substrate SUB. The first conductive layer may include a bottom metal layer BML, and the bottom metal layer BML may overlap a first active layer ACT1 of a first transistor T1. The bottom metal layer BML may prevent light from entering the first active layer ACT1 of the first transistor T1 and/or may be electrically connected to the first active layer ACT1 to stabilize electrical characteristics of the first transistor T1. However, the bottom metal layer BML may be omitted.

A buffer layer BL may be disposed on the first conductive layer and the first substrate SUB. The buffer layer BL may be formed on the first substrate SUB to protect transistors of the pixels PX from moisture introduced through the first substrate SUB which is vulnerable to moisture penetration and may perform a surface planarization function.

The semiconductor layer may be disposed on the buffer layer BL. The semiconductor layer may include the first active layer ACT1 of the first transistor T1 and a second active layer ACT2 of a second transistor T2. The first active layer ACT1 and the second active layer ACT2 may respectively partially overlap a first gate electrode G1 and a second gate electrode G2 of a second conductive layer which will be described later.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may include at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel SPXn of the display device 10 in the drawings, the disclosure is not limited thereto, and the display device 10 may include a greater number of transistors.

A first gate insulating layer GI may be disposed on the semiconductor layer and the buffer layer BL in the display area DPA. The first gate insulating layer GI may not be disposed in the pad area PDA. The first gate insulating layer GI may serve as a gate insulating film for each of the transistors T1 and T2. In the drawings, the first gate insulating layer GI is disposed on the entire surface of the buffer layer BL, but the disclosure is not limited thereto. In some embodiments, the first gate insulating layer GI may be patterned together with the gate electrodes G1 and G2 of the second conductive layer to be described later and thus may be partially disposed between the second conductive layer and the active layers ACT1 and ACT2 of the semiconductor layer.

The second conductive layer may be disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is a thickness direction, and the second gate electrode G2 may overlap a channel region of the second active layer ACT2 in the third direction DR3 which is the thickness direction. Although not illustrated in the drawings, the second conductive layer may further include an electrode of a storage capacitor.

A first interlayer insulating layer IL may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer IL1. The third conductive layer may include a first voltage wiring VL1 and a second voltage wiring VL2 disposed in the display area DPA, a first conductive pattern CDP1, and a source electrode S1 or S2 and a drain electrode D1 or D2 of each of the transistors T1 and T2. Although not illustrated in the drawings, the third conductive layer may further include another electrode of the storage capacitor.

A high potential voltage (or a first power supply voltage) supplied to the first electrode RME1 may be applied to the first voltage wiring VL1, and a low potential voltage (or a second power supply voltage) supplied to the second electrode RME2 may be applied to the second voltage wiring VL2. A portion of the first voltage wiring VL1 may electrically contact the first active layer ACT1 of the first transistor T1 through a contact hole penetrating the first interlayer insulating layer IL1 and the first gate insulating layer G1.

The first voltage wiring VL1 may serve as a first drain electrode D1 of the first transistor T1. The second voltage wiring VL2 may be directly connected to the second electrode RME2 to be described later.

The first conductive pattern CDP1 may electrically contact the first active layer ACT1 of the first transistor T1 through a contact hole penetrating the first interlayer insulating layer IL1 and the first gate insulating layer G1. The first conductive pattern CDP1 may electrically contact the bottom metal layer BML through another contact hole. The first conductive pattern CDP1 may serve as a first source electrode S1 of the first transistor T1. The first conductive pattern CDP1 may be electrically connected to the first electrode RME1 and/or the first connection electrode CNE1 to be described later. The first transistor T1 may transmit the first power supply voltage received from the first voltage wiring VL1 to the first electrode RME1 and/or the first connection electrode CNE1.

Each of a second source electrode S2 and a second drain electrode D2 may electrically contact the second active layer ACT2 of the second transistor T2 through a contact hole penetrating the first interlayer insulating layer IL1 and the first gate insulating layer G1. The second transistor T2 may be any one of the switching transistors described above with reference to FIG. 3. The second transistor T2 may transmit a signal received from the data line DTL of FIG. 3 to the first transistor T1 or transmit a signal received from the initialization voltage wiring VII of FIG. 3 to the another electrode of the storage capacitor.

A first passivation layer PV1 may be disposed on the third conductive layer. The first passivation layer PV1 may function as an insulating film between the third conductive layer and other layers and may protect the third conductive layer.

Each of the buffer layer BL, the first gate insulating layer G1, the first interlayer insulating layer IL1, and the first passivation layer PV1 described above may be composed of multiple inorganic layers alternately stacked each other. For example, each of the buffer layer BL, the first gate insulating layer G1, the first interlayer insulating layer IL1, and the first passivation layer PV1 may include a double layer in which inorganic layers including at least any one of silicon oxide ($SiO_x$), silicon nitride ($SiN_x$), and silicon oxynitride ($SiO_xN_y$) are stacked each other or may include a multilayer in which the above inorganic layers are alternately stacked each other. However, the disclosure is not limited thereto, and each of the buffer layer BL, the first gate insulating layer G1, the first interlayer insulating layer IL1, and the first passivation layer PV1 may be composed of one inorganic layer including any one of the above insulating materials. In some embodiments, the first interlayer insulating layer IL1 may be made of an organic insulating material such as polyimide (PI).

A via layer VIA may be disposed on the third conductive layer in the display area DPA. The via layer VIA may include an organic insulating material such as polyimide (PI) to compensate for a step difference due to the conductive layers thereunder and may form a flat upper surface. However, in some embodiments, the via layer VIA may be omitted.

The display device 10 may include, as a display element layer disposed on the via layer VIA of the wiring substrate 101, the barrier walls BP1 and BP2, the electrodes RME (RME1 and RME2), the bank layer BNL, the light emitting elements ED, and the connection electrodes CNE (CNE1 and CNE2). The display device 10 may include multiple insulating layers PAS1 through PAS3 disposed on the wiring substrate 101.

The barrier walls BP1 and BP2 may be disposed on the via layer VIA. For example, the barrier walls BP1 and BP2 may be directly disposed on the via layer VIA, and at least a portion of each of the barrier walls BP1 and BP2 may protrude from the upper surface of the via layer VIA. The protruding portion of each of the barrier walls BP1 and BP2 may have inclined side surfaces or curved side surfaces with a predetermined (or selectable) curvature, and light emitted from the light emitting elements ED may be reflected upward above the via layer VIA by the electrodes RME disposed on the barrier walls BP1 and BP2. Unlike in the drawings, each of the barrier walls BP1 and BP2 may have a shape having an outer surface curved with a predetermined (or selectable) curvature in a cross-sectional view, for example, may have a semicircular or semielliptical shape. The barrier walls BP1 and BP2 may include, but are not limited to, an organic insulating material such as polyimide (PI).

The electrodes RME (RME1 and RME2) may be disposed on the barrier walls BP1 and BP2 and the via layer VIA. For example, the first electrode RME1 and the second electrode RME2 may be disposed on at least the inclined side surfaces of the barrier walls BP1 and BP2. Widths of the electrodes RME measured in the second direction DR2 may be smaller than widths of the barrier walls BP1 and BP2 measured in the second direction DR2, and a distance between the first electrode RME1 and the second electrode RME2 in the second direction DR2 may be smaller than a distance between the barrier walls BP1 and BP2. At least a portion of each of the first electrode RME1 and the second electrode RME2 may be directly disposed on the via layer VIA so that they are disposed on a same plane.

The light emitting elements ED disposed between the barrier walls BP1 and BP2 may emit light in directions from both ends thereof, and a portion of the emitted light may travel toward the electrodes RME disposed on the barrier walls BP1 and BP2. Each electrode RME may have a structure in which a portion disposed on a barrier wall BP1 or BP2 may reflect light emitted from the light emitting elements ED. Each of the first electrode RME1 and the second electrode RME2 may cover at least a side surface of the barrier wall BP1 or BP2 to reflect light emitted from the light emitting elements ED.

Each of the electrodes RME may directly contact the third conductive layer through an electrode contact hole CTD or CTS in a portion overlapping the bank layer BNL between the emission area EMA and the sub-area SA. A first electrode contact hole CTD may be formed in an area in which the bank layer BNL and the first electrode RME1 overlap, and a second electrode contact hole CTS may be formed in an area in which the bank layer BNL and the second electrode RME2 overlap. The first electrode RME1 may electrically contact the first conductive pattern CDP1 through the first electrode contact hole CTD penetrating the via layer VIA and the first passivation layer PV1. The second electrode RME2 may electrically contact the second voltage wiring VL2 through the second electrode contact hole CTS penetrating the via layer VIA and the first passivation layer PV1. The first electrode RME1 may be electrically connected to the first transistor T1 through the first conductive pattern CDP1 to receive the first power supply voltage, and the second electrode RME2 may be electrically connected to the second voltage wiring VL2 to receive the second power supply voltage. However, the disclosure is not limited thereto. In an embodiment, the electrodes RME1 and RME2 may not be electrically connected to the voltage wirings VL1 and VL2 of the third conductive layer, and the connection electrodes CNE to be described later may be directly connected to the third conductive layer.

The electrodes RME may include a conductive material having high reflectivity. For example, each of the electrodes RME may include a metal such as silver (Ag), copper (Cu), or aluminum (Al), or an alloy including aluminum (Al), nickel (Ni), or lanthanum (La), or may have a structure in which a metal layer such as titanium (Ti), molybdenum (Mo), or niobium (Nb) and the above alloy are stacked each other. In some embodiments, each of the electrodes RME may include a double layer or a multilayer in which an alloy including aluminum (Al) and at least one metal layer made of titanium (Ti), molybdenum (Mo), or niobium (Nb) are stacked each other.

However, the disclosure is not limited thereto, and each electrode RME may include a transparent conductive material. For example, each electrode RME may include a material such as ITO, IZO or ITZO. In some embodiments, each electrode RME may have a structure in which a transparent conductive material and a metal layer having high reflectivity are stacked each other with one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED to an upward direction above the first substrate SUB.

A first insulating layer PAS1 may be disposed in the entire display area DPA and may be disposed on the via layer VIA and the electrodes RME. The first insulating layer PAS1 may protect the electrodes RME while insulating them from each other. Since the first insulating layer PAS1 covers the electrodes RME before the bank layer BNL is formed, it may prevent the electrodes RME from being damaged in the process of forming the bank layer BNL. The first insulating layer PAS1 may also prevent the light emitting elements ED disposed thereon from directly contacting other members and thus being damaged.

In an embodiment, the first insulating layer PAS1 may be stepped such that a portion of an upper surface of the first insulating layer PAS1 is recessed between the electrodes RME spaced apart from each other in the second direction DR2. The light emitting elements ED may be disposed on the stepped upper surface of the first insulating layer PAS1, and a space may be formed between the light emitting elements ED and the first insulating layer PAS1.

The first insulating layer PAS1 may include contact portions CT1 and CT2 disposed in the sub-area SA. The contact portions CT1 and CT2 may overlap different electrodes RME, respectively. For example, the first insulating layer PAS1 may include a first contact portion CT1 overlapping the first electrode RME1 and a second contact portion CT2 overlapping the second electrode RME2. The first contact portion CT1 and the second contact portion CT2 may penetrate the first insulating layer PAS1 to expose a portion of an upper surface of the first electrode RME1 or the second electrode RME2 thereunder. Each of the first contact portion CT1 and the second contact portion CT2 may further penetrate some of the other insulating layers disposed on the first insulating layer PAS1. An electrode RME exposed by each of the contact portions CT1 and CT2 may electrically contact a connection electrode CNE.

The bank layer BNL may be disposed on the first insulating layer PAS1. The bank layer BNL may include portions extending in the first direction DR1 and the second direction DR2 and may surround each subpixel SPXn. The bank layer BNL may surround the emission area EMA and the sub-area SA of each subpixel SPXn to separate them and may surround the outermost periphery of the display area DPA to separate the display area DPA and the non-display area NDA.

Like the barrier walls BP1 and BP2, the bank layer BNL may have a predetermined (or selectable) height. In some embodiments, an upper surface of the bank layer BNL may be higher than those of the barrier walls BP1 and BP2, and a thickness of the bank layer BNL may be equal to or greater than those of the barrier walls BP1 and BP2 in the third direction DR3. The bank layer BNL may prevent ink from overflowing to adjacent subpixels SPXn in an inkjet printing process during a manufacturing process of the display device 10. Like the barrier walls BP1 and BP2, the bank layer BNL may include an organic insulating material such as polyimide.

The light emitting elements ED may be disposed in the emission area EMA. The light emitting elements ED may be disposed on the first insulating layer PAS1 between the barrier walls BP1 and BP2. A direction in which the light emitting elements ED extend may be substantially parallel to an upper surface of the first substrate SUB1. As will be described later, each light emitting element ED may include multiple semiconductor layers disposed in the extending direction, and the semiconductor layers may be sequentially disposed in a direction parallel to the upper surface of the first substrate SUB. However, the disclosure is not limited thereto. In case that each of the light emitting elements ED has a different structure, the semiconductor layers may be disposed in a direction perpendicular to the first substrate SUB.

The light emitting elements ED disposed in the subpixels SPXn may emit light of different wavelength bands depending on the materials that form the semiconductor layers described above. However, the disclosure is not limited thereto, and the light emitting elements ED disposed in the subpixels SPXn may emit light of the same color by including the semiconductor layers made of the same material.

The light emitting elements ED may be electrically connected to the electrodes RME and the conductive layers under the via layer VIA by electrically contacting the connection electrodes CNE (CNE1 and CNE2) and may emit light of a specific wavelength band in response to an electrical signal.

A second insulating layer PAS2 may be disposed on the light emitting elements ED, the first insulating layer PAS1, and the bank layer BNL. The second insulating layer PAS2 may include a pattern portion extending in the first direction DR1 between the barrier walls BP1 and BP2 and disposed on the light emitting elements ED. The pattern portion may partially cover outer peripheral surfaces of the light emitting elements ED and may not cover both sides or both ends of the light emitting elements ED. The pattern portion may form a linear or island-shaped pattern in each subpixel SPXn in a plan view. The pattern portion of the second insulating layer PAS2 may protect the light emitting elements ED while anchoring the light emitting elements ED in the manufacturing process of the display device 10. The second insulating layer PAS2 may also fill the space between the light emitting elements ED and the first insulating layer PAS1 under the light emitting elements ED. A portion of the second insulating layer PAS2 may be disposed on the bank layer BNL and in the sub-areas SA.

The connection electrodes CNE (CNE1 and CNE2) may be disposed on the electrodes RME and the barrier walls BP1 and BP2. The first connection electrode CNE1 may be disposed on the first electrode RME1 and the first barrier wall BP1. The first connection electrode CNE1 may partially overlap the first electrode RME1 and may extend from the emission area EMA to the sub-area SA through the bank layer BNL. The second connection electrode CNE2 may be disposed on the second electrode RME2 and the second barrier wall BP2. The second connection electrode CNE2 may partially overlap the second electrode RME2 and may extend from the emission area EMA to the sub-area SA through the bank layer BNL.

Each of the first connection electrode CNE1 and the second connection electrode CNE2 may electrically contact the light emitting elements ED. The first connection electrode CNE1 may partially overlap the first electrode RME1 and may electrically contact an end of each light emitting element ED. The second connection electrode CNE2 may partially overlap the second electrode RME2 and may electrically contact another end of each light emitting element ED. The connection electrodes CNE may be disposed in the emission area EMA and the sub-area SA. Each of the connection electrodes CNE may electrically contact the light emitting elements ED in a portion disposed in the emission area EMA and may be electrically connected to the third conductive layer in a portion disposed in the-sub area SA. The first connection electrode CNE1 may electrically contact first ends of the light emitting elements ED, and the second connection electrode CNE2 may electrically contact second ends of the light emitting elements ED.

In the display device 10, each of the connection electrodes CNE may electrically contact an electrode RME through a contact portion CT1 or CT2 disposed in the sub-area SA. The first connection electrode CNE1 may electrically contact the first electrode RME1 through the first contact portion CT1 penetrating the first insulating layer PAS1, the second insulating layer PAS2 and a third insulating layer PAS3 in the sub-area SA. The second connection electrode CNE2 may electrically contact the second electrode RME2 through the second contact portion CT2 penetrating the first insulating layer PAS1 and the second insulating layer PAS2 in the sub-area SA. The connection electrodes CNE may be electrically connected to the third conductive layer through the electrodes RME, respectively. The first connection electrode CNE1 may be electrically connected to the first transistor T1 to receive the first power supply voltage, and the second connection electrode CNE2 may be electrically connected to the second voltage wiring VL2 to receive the second power supply voltage. Each of the connection electrodes CNE may electrically contact the light emitting elements ED in the emission area EMA to transmit a power supply voltage to the light emitting elements ED.

However, the disclosure is not limited thereto. In some embodiments, the connection electrodes CNE may directly contact the third conductive layer or may be electrically connected to the third conductive layer through patterns other than the electrodes RME.

The connection electrodes CNE may include a conductive material such as ITO, IZO, ITZO, or aluminum (Al). For example, the connection electrodes CNE may include a transparent conductive material, and light emitted from the light emitting elements ED may pass through the connection electrodes CNE.

The third insulating layer PAS3 may be disposed on the second connection electrode CNE2 and the second insulating layer PAS2. The third insulating layer PAS3 may be disposed on the entire surface of the second insulating layer PAS2 to cover the second connection electrode CNE2, and the first connection electrode CNE1 may be disposed on the third insulating layer PAS3. The third insulating layer PAS3 may be disposed on the entire surface of the via layer VIA except for an area in which the first connection electrode CNE1 is disposed. The third insulating layer PAS3 may insulate the first connection electrode CNE1 and the second connection electrode CNE2 from each other so that they do not directly contact each other.

Although not illustrated in the drawings, another insulating layer may be further disposed on the third insulating layer PAS3 and the first connection electrode CNE1. The another insulating layer may protect members disposed on the first substrate SUB from an external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, and the second insulating layer PAS2 may include an organic insulating material. Each or at least one of the first insulating layer PAS1, the second insulating layer PAS2, and the third insulating layer PAS3 may be formed in a structure in which multiple insulating layers are alternately or repeatedly stacked each other. In an embodiment, each of the first insulating layer PAS1, the second insulating layer PAS2, and the third insulating layer PAS3 may include at least one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material, or some may be made of the same material while the others are made of different materials, or all of them may be made of different materials.

Figure 7:
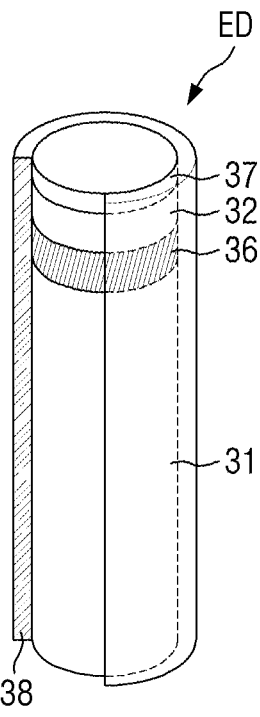
FIG. 7 is a schematic cross-sectional view of a light emitting element according to an embodiment.

FIG. 7 is a schematic cross-sectional view of a light emitting element ED according to an embodiment.

Referring to FIG. 7, the light emitting element ED may be a light emitting diode. For example, the light emitting element ED may be an inorganic light emitting diode having a size of nanometers to micrometers and made of an inorganic material. In case that an electric field is formed in a specific direction between two electrodes facing each other, the light emitting element ED may be aligned between the two electrodes in which polarities are formed.

The light emitting element ED according to the embodiment may extend in a direction. The light emitting element ED may have a shape such as a cylinder, a rod, a wire, a tube, or the like. However, the shape of the light emitting element ED is not limited thereto, and the light emitting element ED may have various shapes including polygonal prisms, such as a cube, a rectangular parallelepiped or a hexagonal prism, and a shape extending in a direction and having a partially inclined outer surface.

The light emitting element ED may include a semiconductor layer doped with a dopant of any conductivity type (e.g., a p-type or an n-type). The semiconductor layer may receive an electrical signal from an external power source and emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may include any one or more of AlGaInN, GaN, AlGaN, InGaN, AlN, and InN doped with an n-type dopant. The n-type dopant used to dope the first semiconductor layer 31 may be Si, Ge, Sn, Se, or the like.

The second semiconductor layer 32 may be disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may include any one or more of AlGaInN, GaN, AlGaN, InGaN, AlN, and InN doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may include more layers, for example, may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may include any one or more of AlGaInN, GaN, AlGaN, InGaN, AlN, InN, and SLs doped with an n-type dopant. The semiconductor layer disposed between the second semiconductor layer 32 and the light emitting layer 36 may include any one or more of AlGaInN, GaN, AlGaN, InGaN, AlN, and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which multiple quantum layers and multiple well layers are alternately stacked each other. The light emitting layer 36 may emit light by combination of electron-hole pairs in response to electrical signals received through the first semiconductor layer 31 and the second semiconductor layer 32. The light emitting layer 36 may include a material such as AlGaN, AlGaInN, or InGaN. In particular, in case that the light emitting layer 36 has a multiple quantum well structure in which a quantum layer and a well layer are alternately stacked each other, the quantum layer may include a material such as AlGaN or AlGaInN, and the well layer may include a material such as GaN or AlInN.

The light emitting layer 36 may have a structure in which a semiconductor material having a large band gap energy and a semiconductor material having a small band gap energy are alternately stacked each other or may include group 3 to 5 semiconductor materials depending on the wavelength band of light that it emits. Light emitted from the light emitting layer 36 is not limited to light in a blue wavelength band. In another embodiment, the light emitting layer 36 may emit light in a red or green wavelength band.

The electrode layer 37 may be an ohmic connection electrode. However, the disclosure is not limited thereto, and the electrode layer 37 may be a Schottky connection electrode. The light emitting element ED may include at least one electrode layer 37. The light emitting element ED may include one or more electrode layers 37. However, the disclosure is not limited thereto, and the electrode layer 37 may be omitted.

In case that the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 may surround outer peripheral surfaces of the semiconductor layers and the electrode layer described above. For example, the insulating film 38 may surround an outer surface of at least the light emitting layer 36 and may expose both ends of the light emitting element ED in a longitudinal direction. An upper surface of the insulating film 38 may be rounded in a cross-sectional view in an area adjacent to at least one end of the light emitting element ED.

The insulating film 38 may include an insulating material, for example, at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is illustrated as a single layer in the drawing, the disclosure is not limited thereto. In some embodiments, the insulating film 38 may be formed in a multilayer structure in which multiple layers are stacked each other.

The insulating film 38 may protect the semiconductor layers and the electrode layer of the light emitting element ED. The insulating film 38 may prevent an electrical short circuit that may occur in the light emitting layer 36 in case that the light emitting layer 36 directly contacts an electrode that transmits an electrical signal to the light emitting element ED. The insulating film 38 may prevent a reduction in luminous efficiency of the light emitting element ED.

An outer surface of the insulating film 38 may be treated. The light emitting element ED may be sprayed onto electrodes in a state where it is dispersed in a predetermined (or selectable) ink and may be aligned. The surface of the insulating film 38 may be hydrophobic or hydrophilic-treated so that the light emitting element ED is kept separated in the ink without being agglomerated with other adjacent light emitting elements ED.

Figure 8:
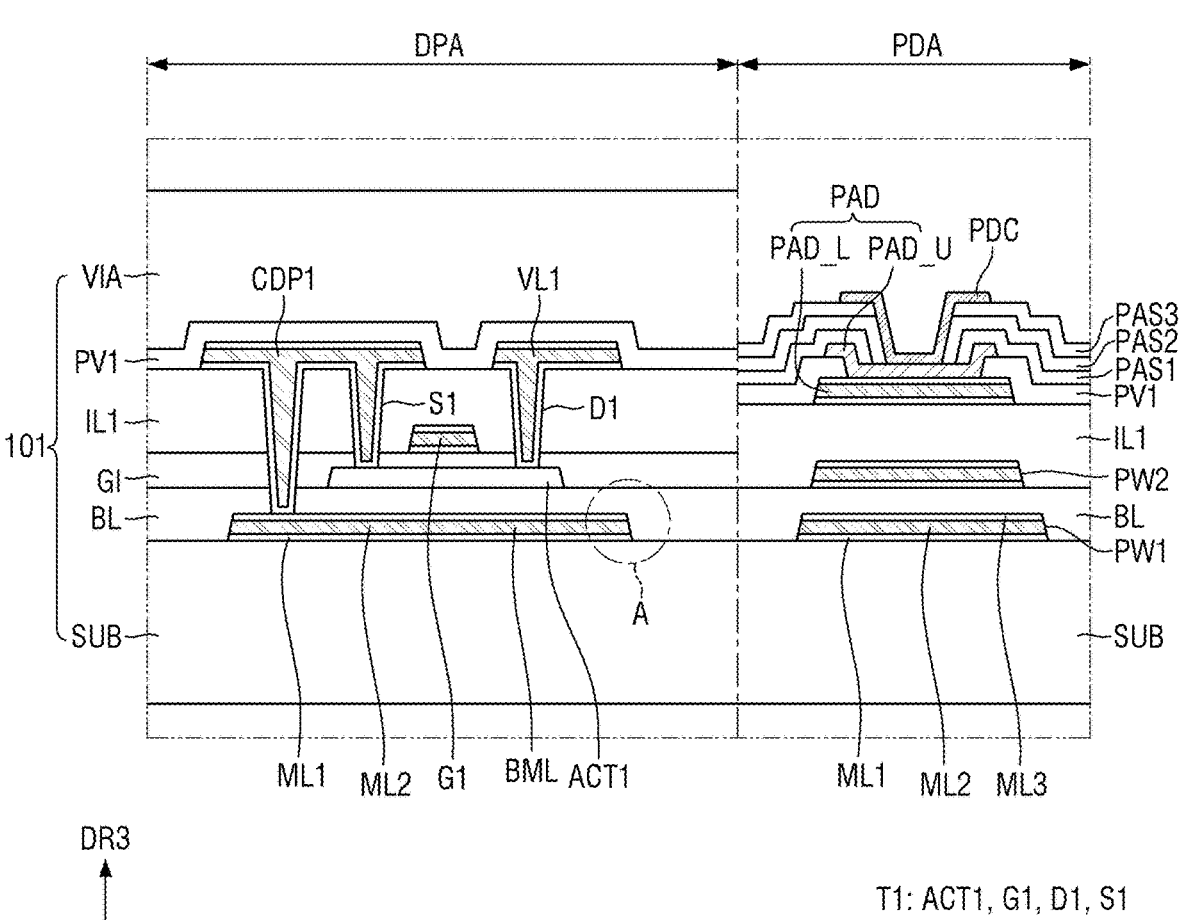
FIG. 8 is a schematic cross-sectional view illustrating a first transistor and a pad electrode formed by multiple wirings and a conductive pattern disposed in a wiring substrate of the display device according to an embodiment.
Figure 9:
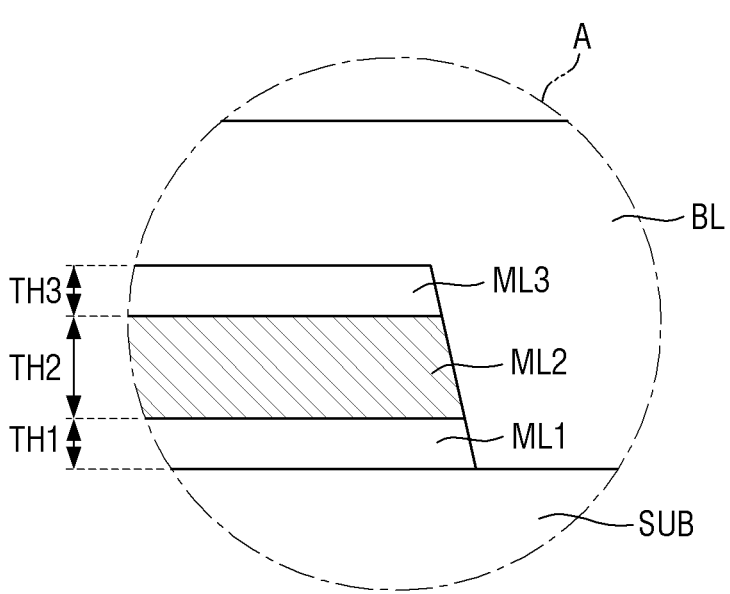
FIG. 9 is an enlarged view of portion A of FIG. 8.

FIG. 8 is a schematic cross-sectional view illustrating the first transistor T1 and a pad electrode PAD formed by multiple wirings and a conductive pattern disposed in the wiring substrate 101 of the display device 10 according to an embodiment. FIG. 9 is an enlarged view of portion A of FIG. 8.

FIGS. 8 and 9 illustrate the first transistor T1 disposed in the display area DPA of the display device 10 and multiple pad wirings PW1 and PW2 and the pad electrode PAD disposed in the pad area PDA. FIGS. 8 and 9 illustrate the structure of each conductive layer included in the wiring substrate 101 in more detail.

Referring to FIGS. 8 and 9 in conjunction with FIGS. 5 and 6, the display device 10 according to the embodiment may include multiple pad wirings PW1 and PW2, the pad electrode PAD, and a pad electrode capping layer PDC disposed in the pad area PDA. The pad wirings PW1 and PW2 and a pad electrode base layer PAD_L of the pad electrode PAD may be disposed in the first through third conductive layers of the wiring substrate 101.

For example, the pad wirings PW1 and PW2 may include a first pad wiring PW1 and a second pad wiring PW2. The first pad wiring PW1 may be directly disposed on the first substrate SUB, and the second pad wiring PW2 may be directly disposed on the buffer layer BL. The first pad wiring PW1 may be made of the first conductive layer in the pad area PDA of the wiring substrate 101, and the second pad wiring PW2 may be made of the second conductive layer in the pad area PDA of the wiring substrate 101.

The first pad wiring PW1 and the bottom metal layer BML of the display area DPA may be formed at the same time and may include the same material. The second pad wiring PW2 and the gate electrodes G1 and G2 of the display area DPA may be formed at the same time and may include the same material. Although the first pad wiring PW1 and the second pad wiring PW2 overlap each other in the thickness direction in the drawings, the disclosure is not limited thereto. In some embodiments, each of the first pad wiring PW1 and the second pad wiring PW2 may be electrically connected to any one of the wirings of the first through third conductive layers disposed in the display area DPA, and at least any one of them may be electrically connected to the pad electrode PAD disposed thereon.

The pad electrode PAD may be disposed in the pad area PDA of the wiring substrate 101 and may be electrically connected to any one of the wiring pads WPD described above. Although not illustrated in the drawings, the pad electrode PAD may be electrically connected to any one of the wirings disposed in the display area DPA, and an electrical signal transmitted from a wiring pad WPD may be transferred to the wirings of the display area DPA through the pad electrode PAD.

The pad electrode PAD may include the pad electrode base layer PAD_L and a pad electrode upper layer PAD_U disposed on the pad electrode base layer PAD_L. The pad electrode base layer PAD_L may be directly disposed on the first interlayer insulating layer IL1, and the pad electrode upper layer PAD_U may be directly disposed on the first passivation layer PV1. The via layer VIA of the wiring substrate 101 may be disposed in the display area DPA and the pad area PDA. The pad electrode base layer PAD_L may be made of the third conductive layer. The pad electrode base layer PAD_L and the first conductive pattern CDP1 of the display area DPA may be formed at the same time and may include the same material.

In the pad area PDA, the via layer VIA may be exposed without being disposed on the first passivation layer PV1. The pad electrode upper layer PAD_U and the electrodes RME of the display area DPA may be formed at the same time and may include the same material. The first insulating layer PAS1 disposed in the display area DPA may be directly disposed on the pad electrode upper layer PAD_U and the first passivation layer PV1, and the second insulating layer PAS2 and the third insulating layer PAS3 may be sequentially disposed on the first insulating layer PAS1.

The pad electrode capping layer PDC may be disposed on the third insulating layer PAS3 in the pad area PDA of the wiring substrate 101. The pad electrode capping layer PDC and one of the connection electrodes CNE of the display area DPA may be formed at the same time and may include the same material. The pad electrode capping layer PDC may directly contact the pad electrode upper layer PAD_U through a contact hole penetrating the first insulating layer PAS1, the second insulating layer PAS2 and the third insulating layer PAS3 and may be electrically connected to the pad electrode upper layer PAD_U. The pad electrode capping layer PDC may be disposed on the pad electrode PAD and electrically connected to the pad electrode PAD while protecting the pad electrode PAD. The wiring pad WPD described above may be disposed on the pad electrode capping layer PDC.

According to an embodiment, in the wiring substrate 101 of the display device 10, at least any one of the wirings or conductive patterns of the first through third conductive layers may include multiple metal layers ML1 through ML3. For example, each of the bottom metal layer BML and the first pad wiring PW1 of the first conductive layer may have a structure in which the metal layers ML1 through ML3 having different compositions are sequentially stacked. Each of the first gate electrode G1 and the second pad wiring PW2 of the second conductive layer and each of the first conductive pattern CDP1, the first voltage wiring VL1, and the pad electrode base layer PAD_L of the third conductive layer may also have a structure in which the metal layers ML1 through ML3 having different compositions are sequentially stacked. Each of the wirings or conductive patterns of the first through third conductive layers of the wiring substrate 101 may include the metal layers ML1 through ML3, or the wirings or conductive patterns of any one or more of the first through third conductive layers may include the metal layers ML through ML3, and the other conductive layer may not. The metal layers ML1 through ML3 may be directly disposed on the first substrate SUB, the first gate insulating layer G1, or the first interlayer insulating layer ILL. Lower surfaces of the metal layers ML1 through ML3 may electrically contact the upper surface of the first substrate SUB, the first gate insulating layer G1, or the first interlayer insulating layer IL1.

According to an embodiment, each of the conductive layers included in the wiring substrate 101 of the display device 10 may include a first metal layer ML1, a second metal layer ML2 disposed on the first metal layer ML1, and a third metal layer ML3 disposed on the second metal layer ML2.

The first metal layer ML1 may be a base layer of each of the wirings or conductive patterns of the first through third conductive layers. The first metal layer ML1 of each conductive layer may be directly disposed on the first substrate SUB, the first gate insulating layer G1, or the first interlayer insulating layer IL1. A lower surface of the first metal layer ML1 may contact the upper surface of the first substrate SUB, the first gate insulating layer G1, or the first interlayer insulating layer IL1. The first metal layer ML1 may include a material having a high light absorption and a low light reflectance. For example, the first metal layer ML1 may be made of titanium (Ti) or copper (Cu) or may be made of an alloy including copper (Cu).

The second metal layer ML2 may be an intermediate layer or a main layer of each of the wirings or conductive patterns of the first through third conductive layers. The second metal layer ML2 of each conductive layer may be directly disposed on the first metal layer ML1, and a lower surface of the second metal layer ML2 may contact an upper surface of the first metal layer ML1. The second metal layer ML2 may include a metal material having an excellent electrical conductivity due to its low resistivity. For example, the second metal layer ML2 may be made of pure copper (Cu). As an intermediate layer or a main layer of each of the wirings and conductive patterns of each conductive layer, the second metal layer ML2 may include a material having a high conductivity, and each conductive layer may have excellent electrical conductivity.

The third metal layer ML3 may be an upper layer of each of the wirings or conductive patterns of the first through third conductive layers. The third metal layer ML3 of each conductive layer may be directly disposed on the second metal layer ML2, and a lower surface of the third metal layer ML3 may contact the upper surface of the second metal layer ML2. The third metal layer ML3 may include a metal material having a small grain size. For example, the third metal layer ML3 may be made of a copper alloy including any one of silver (Ag), magnesium (Mg), aluminum (Al), indium (In), niobium (Nb), and boron (B).

According to an embodiment, the second metal layer ML2 and the third metal layer ML3 of each conductive layer included in the wiring substrate 101 of the display device 10 may include copper (Cu), and the third metal layer ML3 may include a copper alloy further including impurity metals. While the second metal layer ML2 may be made of pure copper, the third metal layer ML3 may be made of a copper alloy. A grain size of the third metal layer ML3 may be smaller than a grain size of the second metal layer ML2. In an embodiment, the grain size of the second metal layer ML2 may be about 200 nm or more, and the grain size of the third metal layer ML3 may be about 200 nm or less.

Each conductive layer of the wiring substrate 101 may be formed by depositing metal materials of the first metal layer ML1, the second metal layer ML2, and the third metal layer ML3 and patterning the metal materials. In an embodiment, each conductive layer of the wiring substrate 101 may be patterned by an etching process using a non-hydroperoxide type etchant. In case that the conductive layers of the wiring substrate 101 are etched using the non-hydroperoxide type etchant, the metal layers of the conductive layers may have a different etching rate for the etchant between a grain and a grain boundary. Accordingly, the wirings or conductive patterns of the conductive layers may be patterned along grain boundaries of the materials.

In the wiring substrate 101 according to the embodiment, since the wirings or conductive patterns of each conductive layer include, as an upper layer, the third metal layer ML3 including a copper alloy having a small grain size, their surfaces etched along the grain boundary of the third metal layer ML3 may have a low roughness and thus may be smooth. Side surfaces of the wirings and the conductive patterns included in the conductive layers of the wiring substrate 101 may be patterned to be inclined by an etchant. The side surfaces of each conductive layer may have a taper angle with respect to an upper surface of a layer thereunder. The wirings or conductive patterns of the conductive layers may have a smooth etched surface because the third metal layer ML3 has small grain size, and a taper angle difference that may locally occur at the etched side surfaces may be reduced. Wiring extending in a direction among the conductive layers of the wiring substrate 101 may have smooth side surfaces patterned by the etchant. Therefore, the straightness of the wirings may be improved. Accordingly, in the wiring substrate 101, a step coverage defect that may occur in an insulating film disposed on each conductive layer may be reduced.

As will be described later, a copper alloy may have a smaller grain size than pure copper (Cu) but may have a higher electrical resistance than the pure copper because impurities are added to the copper alloy. If the wirings and conductive patterns of the conductive layers include a metal layer including a copper alloy as a main layer, the straightness of the wirings may be improved, but electrical resistance may increase. Thus, properties of the wirings and the conductive patterns including a copper alloy as conducting wires may not be good. In the wiring substrate 101 and the display device 10 according to the embodiment, the wirings and conductive patterns of each conductive layer may include the second metal layer ML2 made of pure copper (Cu) as an intermediate layer or a main layer and may include the third metal layer ML3 made of a copper alloy having a small grain size as an upper layer or a capping layer. Therefore, the wirings and the conductive patterns may have excellent electrical characteristics and improved wiring straightness. Accordingly, the conductive layers of the wiring substrate 101 and the display device 10 may be prevented from short circuit and burnt defects that may occur in the wirings.

According to an embodiment, a thickness TH3 of the third metal layer ML3 may be smaller than a thickness TH2 of the second metal layer ML2. The third metal layer ML3 and the second metal layer ML2 may include different materials and may perform different functions in each conductive layer of the wiring substrate 101 as described above. The third metal layer ML3 may be a layer disposed on the second metal layer ML2 to improve the straightness of wirings. The third metal layer ML3 may have a thickness enough to allow the second metal layer ML2 and the first metal layer ML1 thereunder to have a smooth etched surface formed in an etching process of metal layers. Since the thickness TH3 of the third metal layer ML3 is smaller than that of the second metal layer ML2, most of the electrical signals flowing through the wirings and conductive patterns of the conductive layers may flow through the second metal layer ML2 having a low electrical resistance.

A thickness TH1 of the first metal layer ML1 may be smaller than the thickness TH2 of the second metal layer ML2. Since the first metal layer ML1 functions to block light incident from the outside, it may be relatively thin compared with the second metal layer ML2.

In an embodiment, in each conductive layer of the wiring substrate 101, the thickness TH1 of the first metal layer ML1 may be about 500 Å or less, and the thickness TH2 of the second metal layer ML2 may be in a range of about 3000 to about 17000 Å or may be about 6000 Å. The thickness TH3 of the third metal layer ML3 may be about 100 Å or more and may be smaller than the thickness TH2 of the second metal layer ML2. Since the third metal layer ML3 has the thickness TH3 within the above range, the etched surfaces of the first metal layer ML1 and the second metal layer ML2 disposed under the third metal layer ML3 may be smooth. Since the thickness TH3 of the third metal layer ML3 is sufficiently smaller than the thickness TH2 of the second metal layer ML2, the main layer of each of the wirings and the conductive patterns may be the second metal layer ML2.

In the wirings or the conductive patterns included in the wiring substrate 101, the third metal layer ML3 made of a copper alloy including impurities may have a smaller grain size than the second metal layer ML2 made of pure copper. According to an embodiment, in the wiring substrate 101, the first metal layer ML1 of each conductive layer may include titanium (Ti), the second metal layer ML2 may include pure copper (Cu), and the third metal layer ML3 may include a copper alloy including copper (Cu) as a main component and including at least any one of silver (Ag), magnesium (Mg), aluminum (Al), indium (In), niobium (Nb), and boron (B) as an impurity metal. The third metal layer ML3 may be a copper alloy including one or more impurity metals while containing copper (Cu) as a main component. For example, the third metal layer ML3 may be an alloy of copper (Cu), aluminum (Al), and magnesium (Mg). The impurity metals included in the copper alloy may penetrate grain boundaries of copper to inhibit the growth of copper grains. Accordingly, a copper alloy including copper as a main component and additionally including a certain amount of other impurity metals may have a smaller grain size than a pure copper metal. For example, the second metal layer ML2 may have a grain size of about 200 nm or more, and the third metal layer ML3 may have a grain size of about 200 nm or less or about 180 nm or less. In some embodiments, the third metal layer ML3 may have a grain size of about 155 nm or less or about 100 nm or less.

The grain size of the third metal layer ML3 may vary depending on the type and content of impurities included in the third metal layer ML3. However, a copper alloy including copper (Cu) as a main component and including a smaller amount of impurities than the copper may have a smaller grain size than the pure copper.

Figure 10:
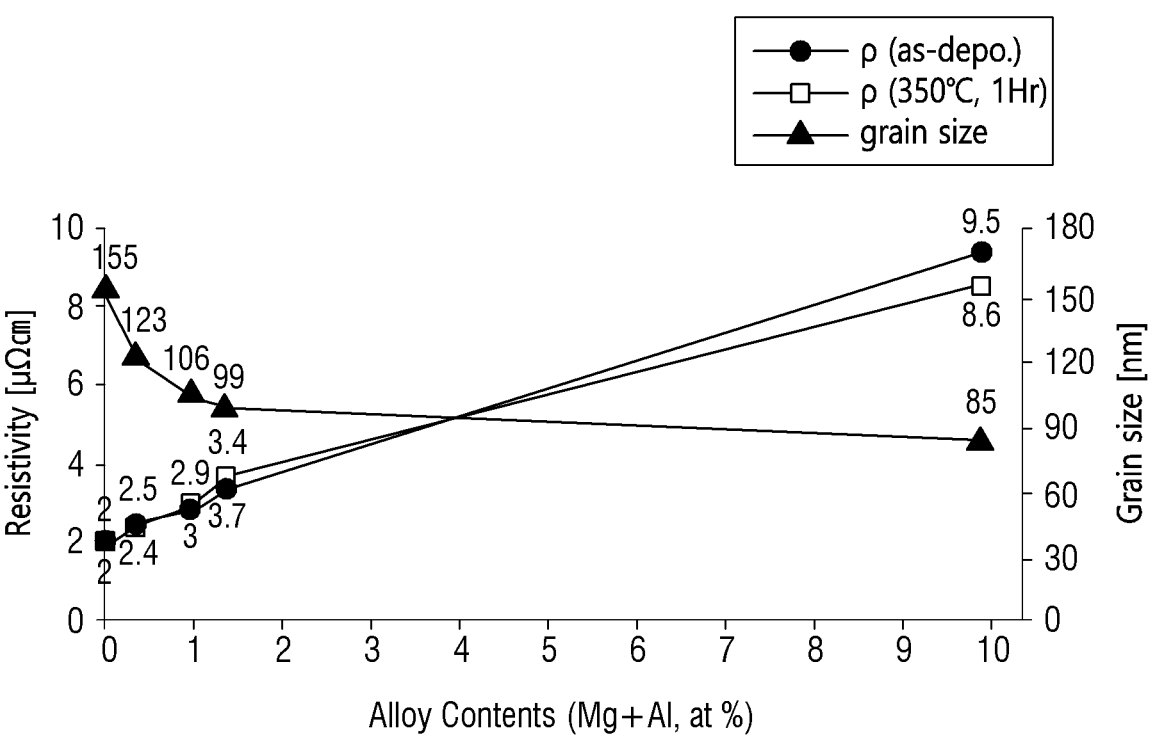
FIGS. 10 and 11 are graphs illustrating a grain size and a resistivity value according to the content of impurities in a copper alloy.
Figure 11:
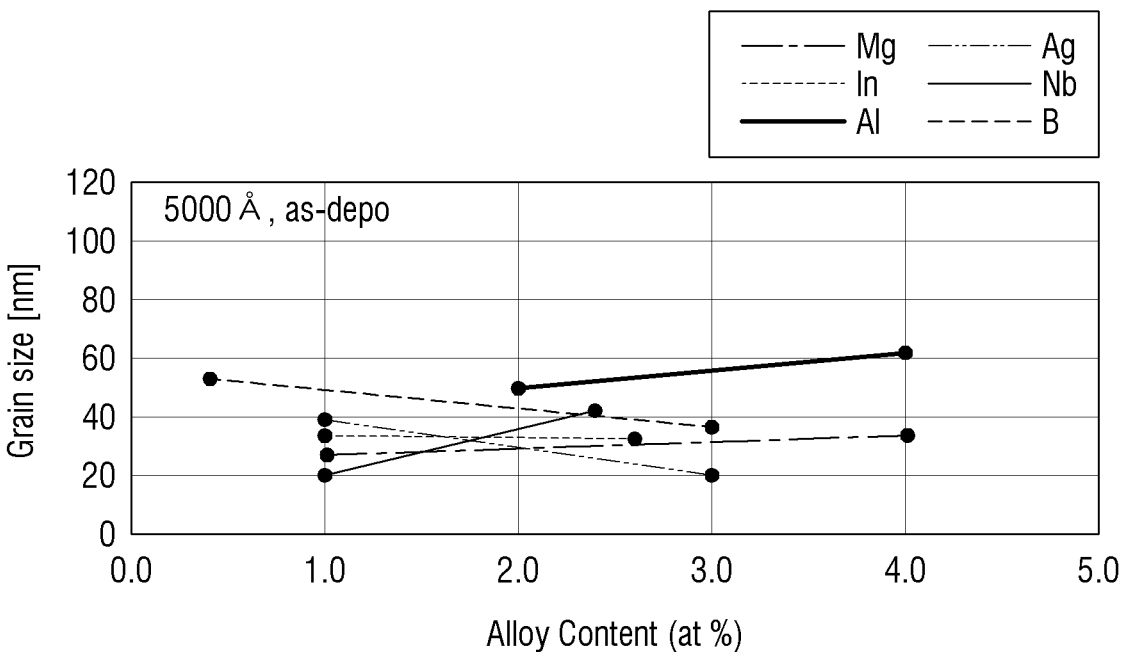

FIGS. 10 and 11 are graphs illustrating a grain size and a resistivity value according to the content of impurities in a copper alloy.

FIG. 10 illustrates a grain size (right Y-axis) and a resistivity value (left Y-axis) according to the content of impurities in a copper alloy including magnesium (Mg) and aluminum (Al) as impurities. As for the resistivity value of the copper alloy, a resistivity value ($\rho$ (as-depo.) in FIG. 10) immediately after the copper alloy was formed and a resistivity value ($\rho$ (350° C., 1 Hr) in FIG. 10) after the copper alloy was heat-treated at 350° C. for one hour were measured. FIG. 11 illustrates a grain size (Y-axis) according to the content of impurities in a copper alloy including various types of impurities.

Referring to FIGS. 10 and 11, in a wiring made of a copper alloy including aluminum (Al) and magnesium (Mg), a grain size of the copper alloy may vary according to the content of the impurity metals. As described above, the impurity metals included in the copper alloy may hinder the growth of copper grains, thereby reducing the grain size of the copper alloy. As is apparent from the graph illustrated in FIG. 10, in case that the content of the impurity metals in the copper alloy is about 0.1 at %, the grain size of the copper alloy may be about 155 nm, and the grain size of the copper alloy may decrease as the content of the impurity metals increases.

As illustrated in FIG. 11, a copper alloy may generally have a small grain size regardless of the type of impurity metal. It may be seen that while pure copper has a grain size of about 273 nm, a copper alloy including any one or more impurities selected from magnesium (Mg), silver (Ag), indium (In), niobium (Nb), aluminum (Al), and boron (B) may have a grain size of about 100 nm or less or about 60 nm or less. The third metal layer ML3 made of a copper alloy may have a grain size corresponding to a quarter of the grain size of the second metal layer ML2 made of pure copper. For example, the copper alloy of the third metal layer ML3 may have a grain size of about 60 nm or less by including an impurity metal in an amount of about 5 at % or less, but the disclosure is not limited thereto. Since the third metal layer ML3 is made of a copper alloy, the type and content of impurity metal may not be particularly limited as long as the grain size of the third metal layer ML3 is smaller than the grain size of at least the second metal layer ML2.

In an embodiment in which each conductive layer of the wiring substrate 101 includes the third metal layer ML3 made of a copper alloy, the third metal layer ML3 may not include calcium (Ca) or cobalt (Co) as impurity metals. In case that the copper alloy includes calcium (Ca) or cobalt (Co), it is impossible to control the grain growth of the copper alloy, and the grain size of the copper alloy may be larger than in case that the copper alloy includes other impurity metals. The third metal layer ML3 may be made of a copper alloy including copper as a main component and further including other impurity metals such as some impurity metals so that the grain growth of the copper alloy may be controlled.

As the content of an impurity metal in a copper alloy increases, the resistivity value of the copper alloy may increase. It was found that in case that the content of the impurity metal in the copper alloy was about 5 at % or more, each of a resistivity value ($\rho$(as-depo.)) immediately after a metal layer was formed and a resistivity value ($\rho$(350° C., 1 Hr)) after the metal layer was heat-treated at 350° C. for one hour was about 5 $\mu\Omega$cm or more. This means that if the wirings and conductive patterns of the wiring substrate 101 include only a metal layer made of a copper alloy in consideration of wiring straightness only, electrical conductivity of the wirings and the conductive patterns may be lowered. In the wiring substrate 101 and the display device 10 according to the embodiment, the wirings and conductive patterns of each conductive layer may include the third metal layer ML3 serving as an upper layer or a capping layer for improving the straightness of wirings and the second metal layer ML2 serving as an intermediate or a main layer having high electrical conductivity. Accordingly, each conductive layer may have sufficient electrical conductivity and excellent wiring straightness.

Figure 12:
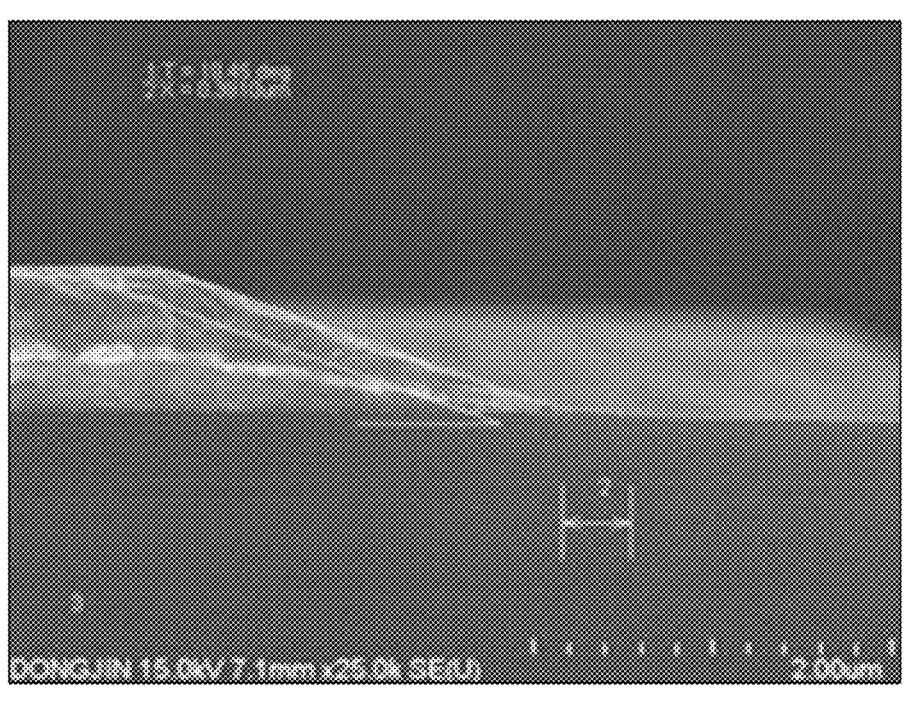
FIGS. 12 and 13 are focused ion beam (FIB) photographs, each showing a taper angle of a wiring or a conductive pattern of a conductive layer.
Figure 13:
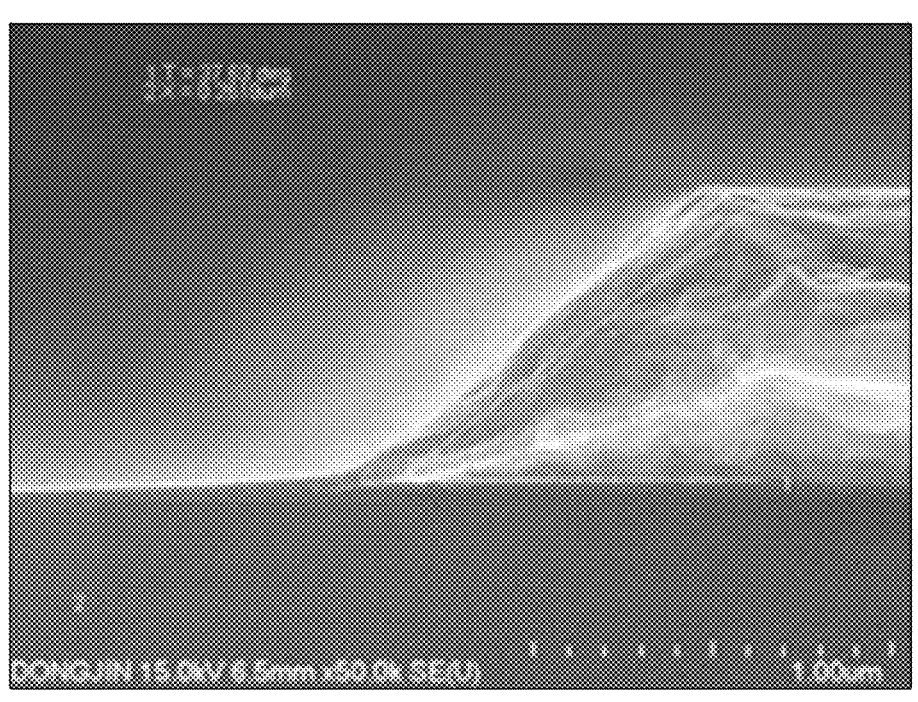

FIGS. 12 and 13 are focused ion beam (FIB) photographs, each showing a taper angle of a wiring or a conductive pattern of a conductive layer.

FIG. 12 shows a side slope of a wiring made of titanium (Ti), copper (Cu), and a magnesium-aluminum copper alloy (CuMgAl) as the first metal layer ML1, the second metal layer ML2, and the third metal layer ML3. In the wiring of FIG. 12, the titanium (Ti) has a thickness of about 200 Å, the copper (Cu) has a thickness of about 8000 Å, and the copper alloy (CuMgAl) has a thickness of about 100 Å.

FIG. 13 shows a side slope of a wiring made of titanium (Ti) and copper (Cu) as the first metal layer ML1 and the second metal layer ML2. In FIG. 13, the titanium (Ti) has a thickness of about 200 Å, and the copper (Cu) has a thickness of about 8000 Å.

Referring to FIGS. 12 and 13, it can be seen that the wiring of FIG. 12 including the magnesium-aluminum copper alloy (CuMgAl) as an upper layer or a capping layer among the two wirings has a gentler side slope than the wiring of FIG. 13 not including the magnesium-aluminum copper alloy. It can also be seen that the wiring of FIG. 12 has a side taper angle of about 18 degrees, and the wiring of FIG. 13 has a side taper angle of about 37 degrees. As the side taper angles of the wirings decrease, an insulating film disposed on the wirings may be formed to have a gentle slope along the slopes of the wirings, and openings may be prevented from being formed in the insulating film due to the roughness of the slope surfaces. The side taper angles may affect the straightness of the wirings.

Figure 14:
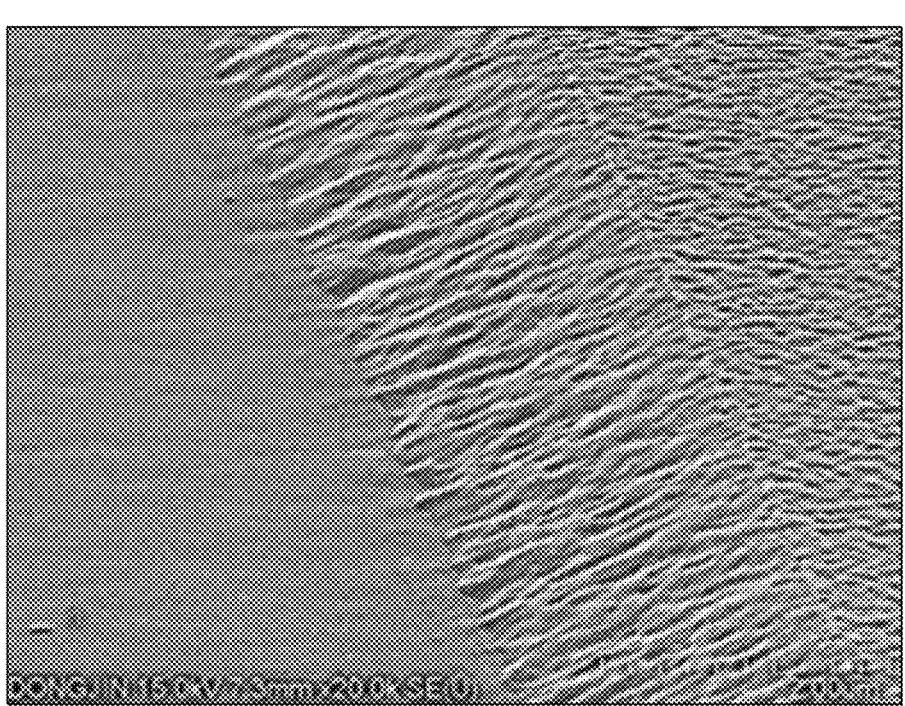
FIGS. 14 and 15 are FIB photographs, each showing surface roughness of a wiring or a conductive pattern of a conductive layer.
Figure 15:
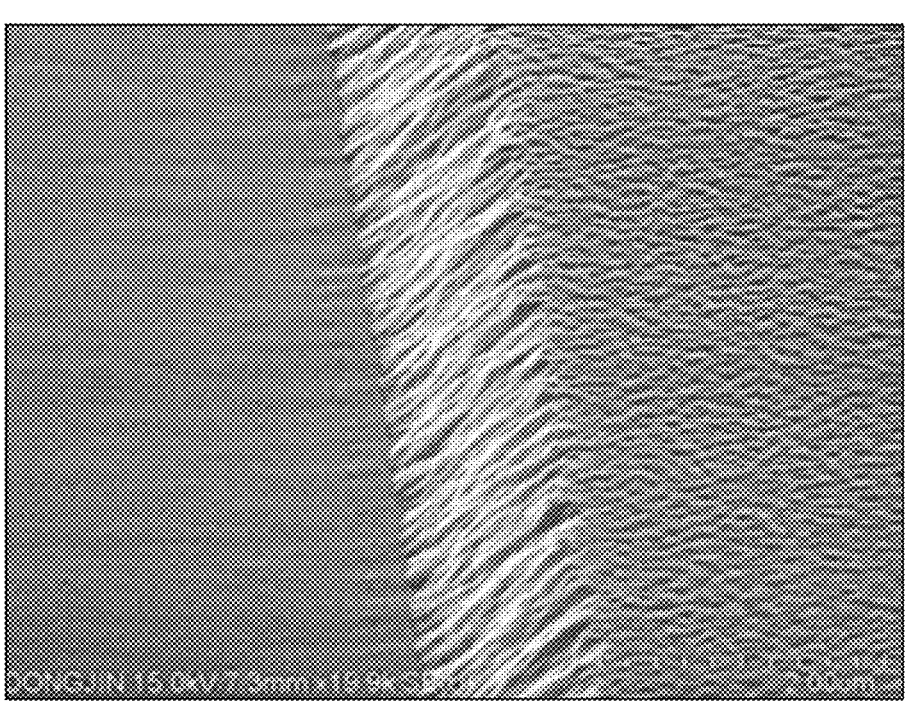
Figure 16:
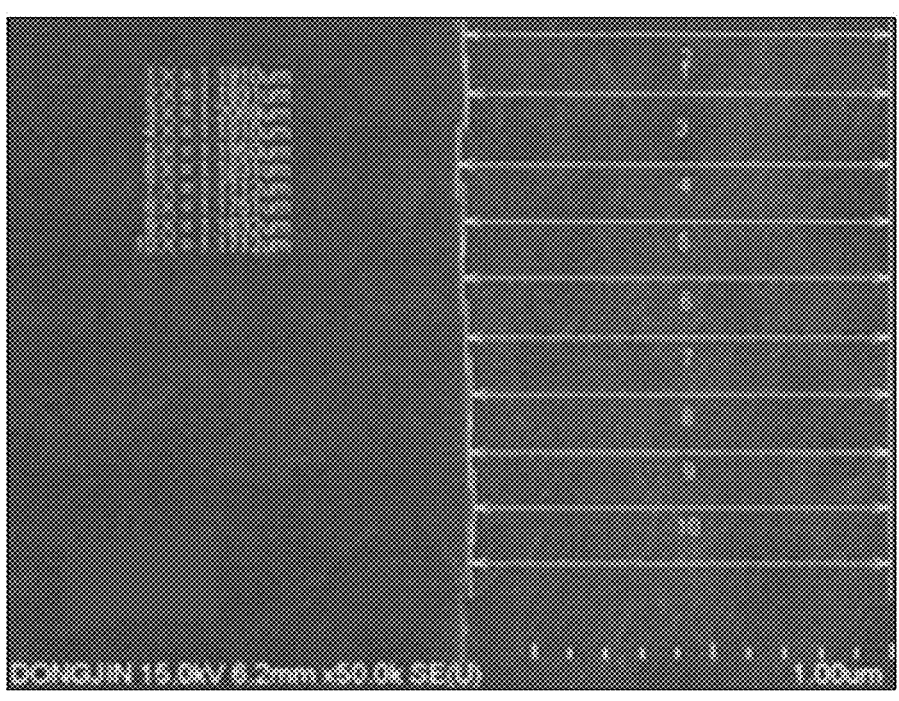
FIGS. 16 and 17 are FIB photographs, each showing a line edge roughness (LER) value of a wiring or a conductive pattern of a conductive layer.
Figure 17:
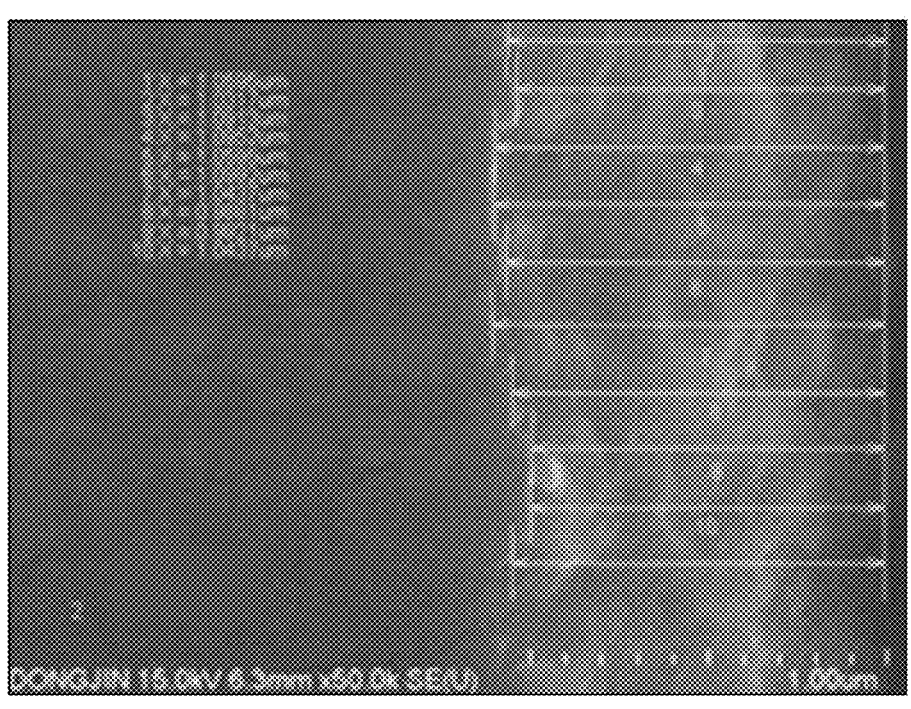

FIGS. 14 and 15 are FIB photographs, each showing surface roughness of a wiring or a conductive pattern of a conductive layer. FIGS. 16 and 17 are FIB photographs, each showing a line edge roughness (LER) value of a wiring or a conductive pattern of a conductive layer.

FIGS. 14 and 15 respectively show side surfaces in a direction in which the wirings of FIGS. 12 and 13 extend. FIGS. 16 and 17 respectively show side surfaces in the direction in which the wirings of FIGS. 12 and 13 extend. The straightness of a wiring may be an inclined side profile of the wiring and may be determined by an inclined side surface in a direction in which the wiring extends.

Referring to FIGS. 14 through 17 in addition to FIGS. 12 and 13, it may be seen that the wirings of FIGS. 14 and 16 including a copper alloy as an upper layer or a capping layer have a small surface roughness and a smooth inclined side surface. Since layers under the upper layer of the copper alloy are etched along the upper layer, a difference in slope according to position on the inclined side surface may be reduced, and the straightness of the side surface extending in a direction may be improved.

According to an embodiment, the wirings and the conductive patterns included in the conductive layers of the wiring substrate 101 may have an LER value of about 0.195 μm or less and a limit voltage value of about 150 V or more because the third metal layer ML3 includes a copper alloy. Since the wirings and the conductive patterns included in the conductive layers of the wiring substrate 101 are improved in wiring straightness, their durability against high voltage may be improved.

An LER value may be calculated by positioning a wiring at a center of an image in each of the photographs of FIGS. 16 and 17 and measuring a distance from an edge of the image to an edge of the wiring. For example, the LER value of the wiring may be calculated by measuring the distance from the edge of the image to the edge of the wiring at some locations (or points) on the wiring and calculating a difference between maximum and minimum values of the distance. In the case of the wirings or the conductive patterns included in the conductive layers of the wiring substrate 101 according to the embodiment, a distance between an edge of a wiring and an edge of an image may be measured at ten locations. A difference between the sum of maximum values of the distance at five locations and the sum of minimum values of the distance at five locations may be calculated. The difference may have a value of about 0.195 an or less.

The wiring of FIG. 16 may have an LER value of about 0.11 μm by including a magnesium-aluminum copper alloy (CuMgAl) as an upper layer, and the wiring of FIG. 17 may have an LER value of about 0.31 μm by not including a copper alloy as an upper layer. It may be seen that a wiring including a copper alloy having a small grain size as an upper layer has a smaller LER value and better wiring straightness than a wiring not including a copper alloy.

In the display device 10 and the wiring substrate 101 according to the embodiment, the wirings or conductive patterns of each conductive layer may have a smooth surface and improved wiring straightness and may be prevented from short circuit and burnt defects that may occur in the wirings.

Other embodiments of the display device 10 will now be described with reference to other drawings.

Figure 18:
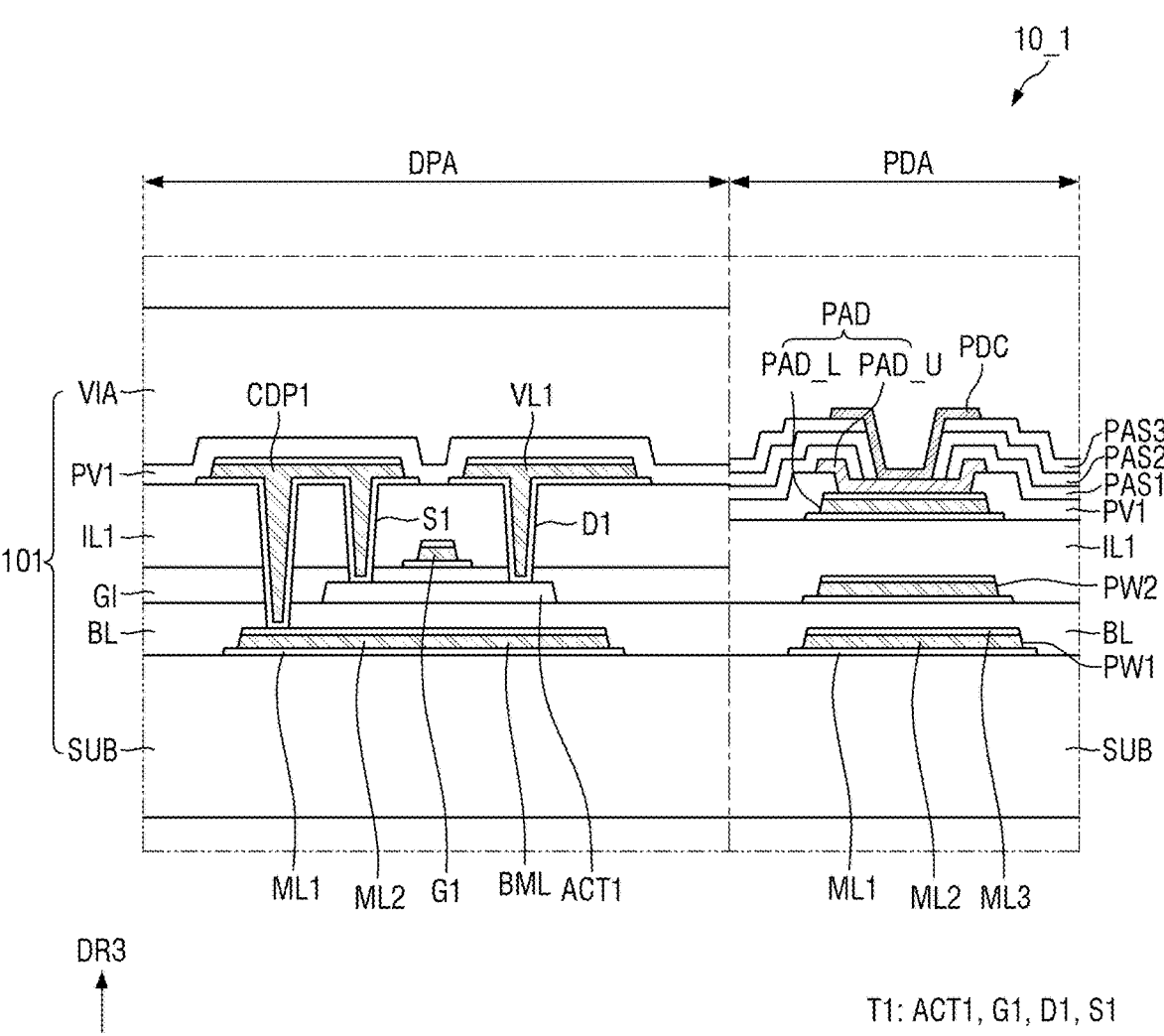
FIG. 18 is a schematic cross-sectional view of a portion of a display device according to an embodiment.

FIG. 18 is a schematic cross-sectional view of a portion of a display device 10_1 according to an embodiment.

Referring to FIG. 18, in a wiring substrate 101 and the display device 10_1 according to the embodiment, each of first through third conductive layers may include a first metal layer ML1, a second metal layer ML2, and a third metal layer ML3. A width of the first metal layer ML1 may be greater than widths of the second metal layer ML2 and the third metal layer ML3 in wirings or conductive patterns of the same conductive layer. For example, both sides of the second metal layer ML2 and the third metal layer ML3 in a width direction may be inwardly spaced apart from both sides of the first metal layer ML1 in the width direction.

The first metal layer ML1, the second metal layer ML2, and the third metal layer ML3 included in each conductive layer of the wiring substrate 101 may be made of different materials. In a process of forming the conductive layers, the first metal layer ML1, the second metal layer ML2, and the third metal layer ML3 may be simultaneously patterned using a non-hydroperoxide type etchant or may each be patterned in a separate process.

In the embodiment of FIG. 8, the first metal layer ML1, the second metal layer ML2, and the third metal layer ML3 may be simultaneously patterned so that both side surfaces of them are aligned with each other. However, the disclosure is not limited thereto, and in case that the first metal layer ML1, the second metal layer ML2, and the third metal layer ML3 are patterned separately or in case that etching process conditions are different, both side surfaces of the first metal layer ML1, the second metal layer ML2, and the third metal layer ML3 may not be aligned with each other.

In the embodiment of FIG. 18, since both side surfaces of the second metal layer ML2 and the third metal layer ML3 are inwardly spaced apart from both side surfaces of the first metal layer ML1, the widths of the second metal layer ML2 and the third metal layer ML3 may be smaller than the width of the first metal layer ML1 in wirings or conductive patterns of the same conductive layer. This relative arrangement of the first metal layer ML1, the second metal layer ML2, and the third metal layer ML3 may be obtained using an etchant having a higher etching rate for the second metal layer ML2 and the third metal layer ML3 than the first metal layer ML1 even in case that the first through third metal layers ML1 through ML3 are patterned separately in different processes or patterned simultaneously.

Figure 19:
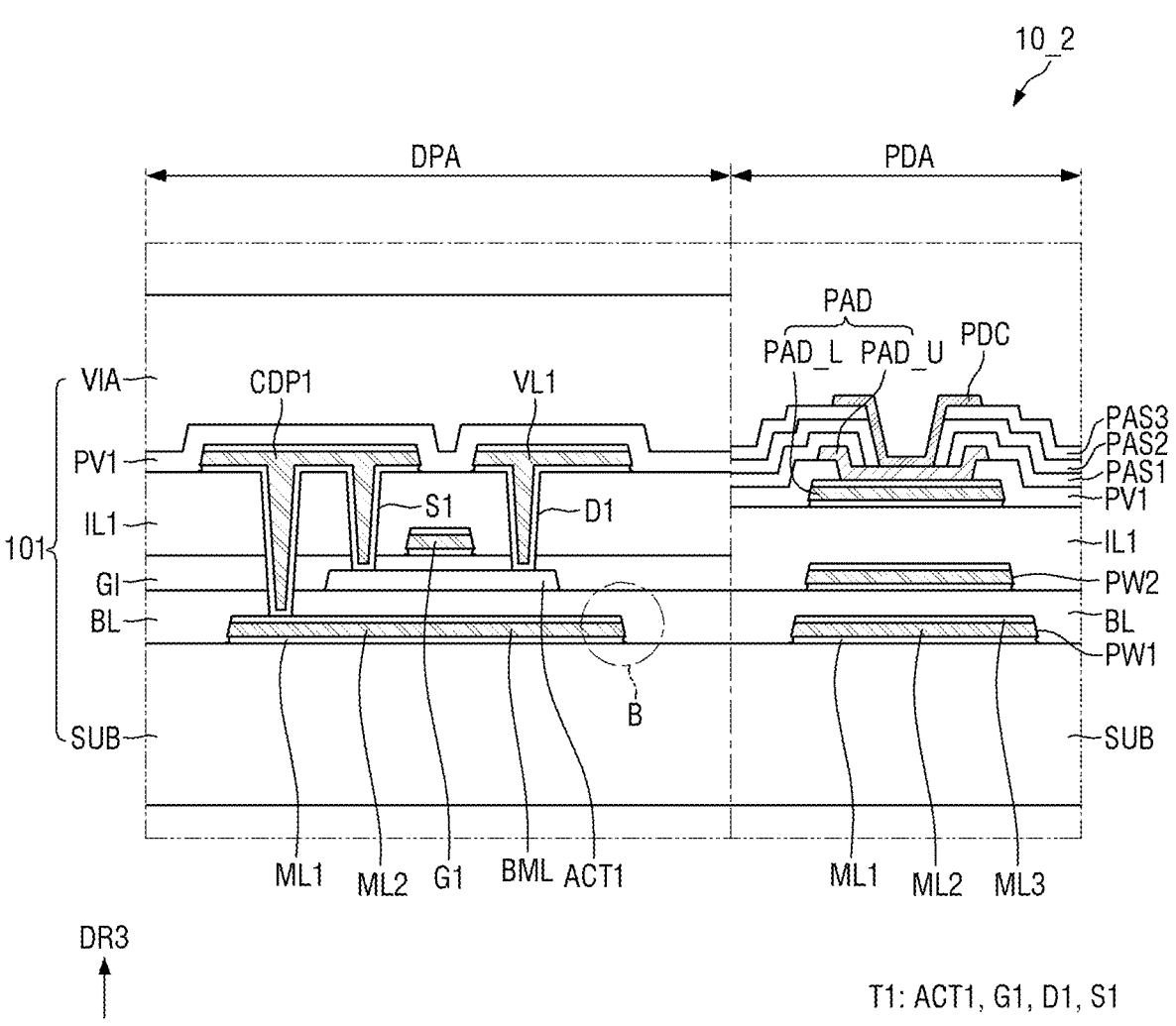
FIG. 19 is a schematic cross-sectional view of a portion of a display device according to an embodiment.
Figure 20:
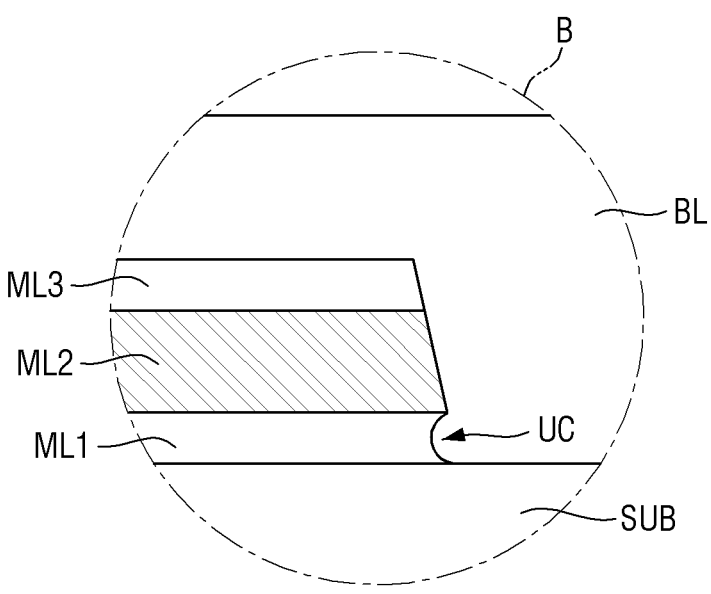
FIG. 20 is an enlarged view of portion B of FIG. 19.

FIG. 19 is a schematic cross-sectional view of a portion of a display device 10_2 according to an embodiment. FIG. 20 is an enlarged view of portion B of FIG. 19.

Referring to FIGS. 19 and 20, in a wiring substrate 101 and the display device 10_2 according to the embodiment, each of first through third conductive layers may include a first metal layer ML1, a second metal layer ML2, and a third metal layer ML3. A width of the first metal layer ML1 may be smaller than a width of the second metal layer ML2 in wirings or conductive patterns of the same conductive layer. For example, the first metal layer ML1 may include an undercut UC formed under the second metal layer ML2 at both sides in the width direction. As described above, the first metal layer ML1 and the second metal layer ML2 may be patterned simultaneously. Depending on conditions of an etching process, the first metal layer ML1 may be etched more than the second metal layer ML2. Accordingly, in an edge portion of a wiring or a conductive pattern, the undercut UC may be formed in the first metal layer ML1 under the second metal layer ML2, and both sides of the first metal layer ML1 in the width direction may be recessed inward from both sides of the second metal layer ML2 in the width direction.

Figure 21:
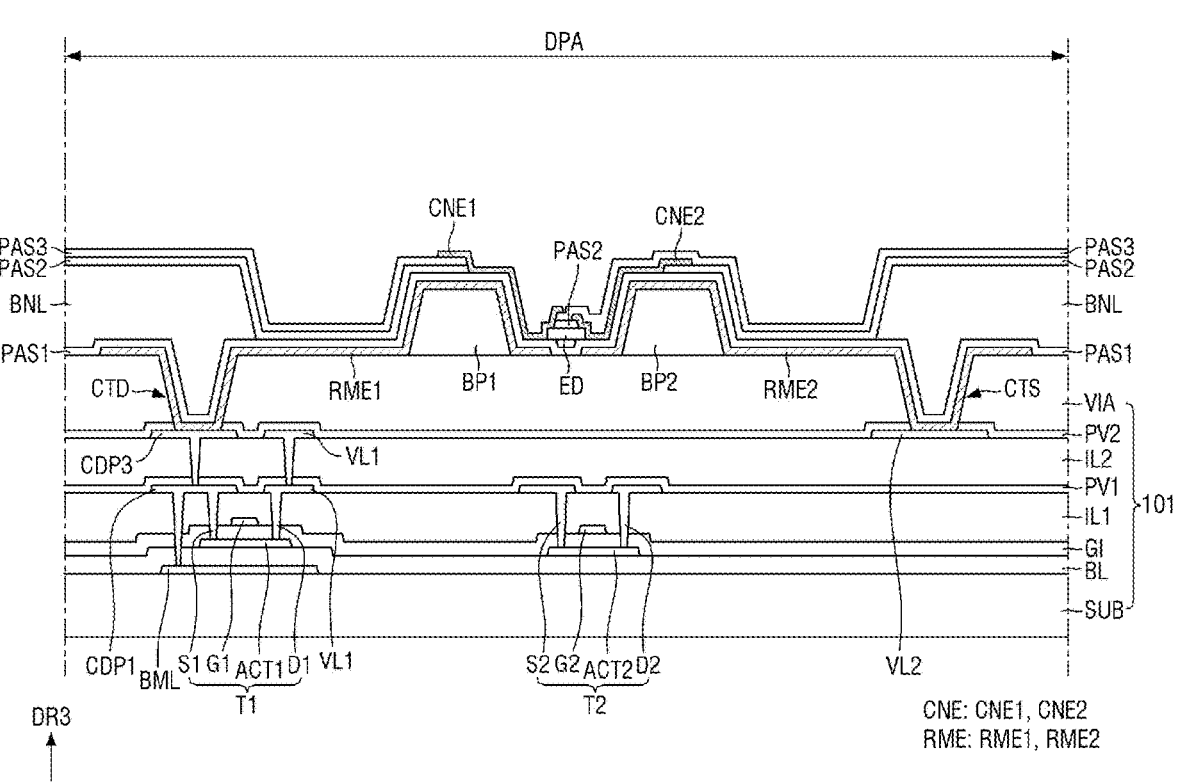
FIG. 21 is a schematic cross-sectional view of a portion of a display device according to an embodiment.

FIG. 21 is a schematic cross-sectional view of a portion of a display device 10 according to an embodiment.

Referring to FIG. 21, in the display device 10 according to the embodiment, a wiring substrate 101 may further include a second interlayer insulating layer IL2, a fourth conductive layer, and a second passivation layer PV2 disposed on a third conductive layer. The embodiment is different from the embodiment of FIG. 5 in that the wiring substrate 101 included in the display device 10 may include a greater number of conductive layers.

The display device 10 and the wiring substrate 101 of the display device 10 may further include the second interlayer insulating layer IL2 disposed on a first passivation layer PV1, the fourth conductive layer disposed on the second interlayer insulating layer IL2, and the second passivation layer PV2 disposed on the fourth conductive layer. A via layer VIA may be disposed on the second passivation layer PV2, and a first electrode contact hole CTD, and a second electrode contact hole CTS may each penetrate the via layer VIA and the second passivation layer PV2.

The wirings or the conductive patterns disposed in the third conductive layer of the embodiment of FIG. 5 may be disposed in different conductive layers in the embodiment of FIG. 21. For example, the third conductive layer may include conductive patterns as a source electrode and a drain electrode of each transistor T1 or T2, for example, a first conductive pattern CDP1 and a second conductive pattern CDP2, and the fourth conductive layer may include a first voltage wiring VL1, a second voltage wiring VL2, and a third conductive pattern CDP3.

The first conductive pattern CDP1 and the second conductive pattern CDP2 may serve as a first source electrode S1 and a first drain electrode D1 of a first transistor T1, respectively. A second source electrode S2 and a second drain electrode D2 of a second transistor T2 may also disposed in the third conductive layer.

The fourth conductive layer may be disposed on the third conductive layer. The first voltage wiring VL1 of the fourth conductive layer may be electrically connected to the second conductive pattern CDP2 of the third conductive layer, and the third conductive pattern CDP3 of the fourth conductive layer may be electrically connected to the first conductive pattern CDP1 of the third conductive layer. The first voltage wiring VL1 may be electrically connected to the first transistor T1 through the second conductive pattern CDP2, and a first electrode RME1 may be electrically connected to the first transistor T1 through the third conductive pattern CDP3. A second electrode RME2 may be directly connected to the second voltage wiring VL2 of the fourth conductive layer.

Each of the third conductive layer and the fourth conductive layer may include a third metal layer ML3 including a copper alloy as described above with reference to FIG. 8. Wirings or conductive patterns of the third conductive layer and the fourth conductive layer may also have a smooth surface and improved straightness.

The second interlayer insulating layer IL2 may be disposed between the third conductive layer and the fourth conductive layer. The second interlayer insulating layer IL2 may be disposed on the first passivation layer PV1 covering the third conductive layer, and the fourth conductive layer may be directly disposed on the second interlayer insulating layer IL2. Like the first interlayer insulating layer IL1, the second interlayer insulating layer IL2 may function as an insulating film between the third conductive layer and the fourth conductive layer and may protect the third conductive layer.

The second passivation layer PV2 may be disposed on the fourth conductive layer. The second passivation layer PV2 may function as an insulating film between the fourth conductive layer and other layers and may protect the fourth conductive layer.

Figure 22:
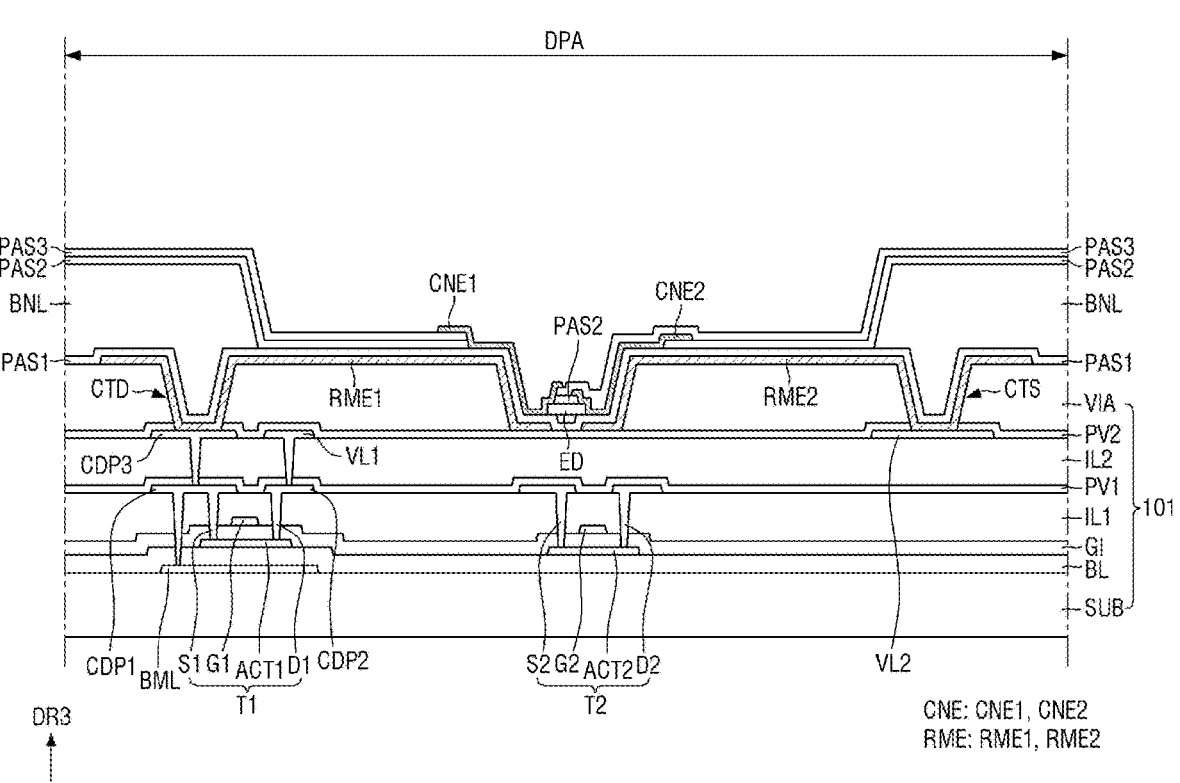
FIG. 22 is a schematic cross-sectional view of a portion of a display device according to an embodiment.

FIG. 22 is a schematic cross-sectional view of a portion of a display device 10 according to an embodiment.

Referring to FIG. 22, in the display device 10 according to the embodiment, barrier walls BP1 and BP2 disposed on a via layer VIA may be omitted, and the via layer VIA may include a trench portion in which light emitting elements ED are disposed. Multiple electrodes RME1 and RME2 and a first insulating layer PAS1 may be disposed in the trench portion of the via layer VIA, and the light emitting elements ED may be disposed on the first insulating layer PAS1 in the trench portion. The trench portion of the via layer VIA may form inclined sidewalls in place of the barrier walls BP1 and BP2, and the electrodes RME1 and RME2 may be disposed on the inclined sidewalls of the trench portion. Therefore, light emitted from the light emitting elements ED may be directed upward.

The trench portion formed in the via layer VIA may penetrate the via layer VIA, like electrode contact holes CTD and CTS. The trench portion of the via layer VIA may expose an upper surface of the second passivation layer PV2 under the via layer VIA, and a portion of each of the electrodes RME1 and RME2 and a portion of the first insulating layer PAS1 may be directly disposed on the second passivation layer PV2.

The embodiment of FIG. 22 is different from the embodiment of FIG. 21 in that the barrier walls BP1 and BP2 are omitted, and the via layer VIA includes, instead of the barrier walls BP1 and BP2, the trench portion in which light emitting elements ED are disposed. Other descriptions are the same as those described above.

Figure 23:
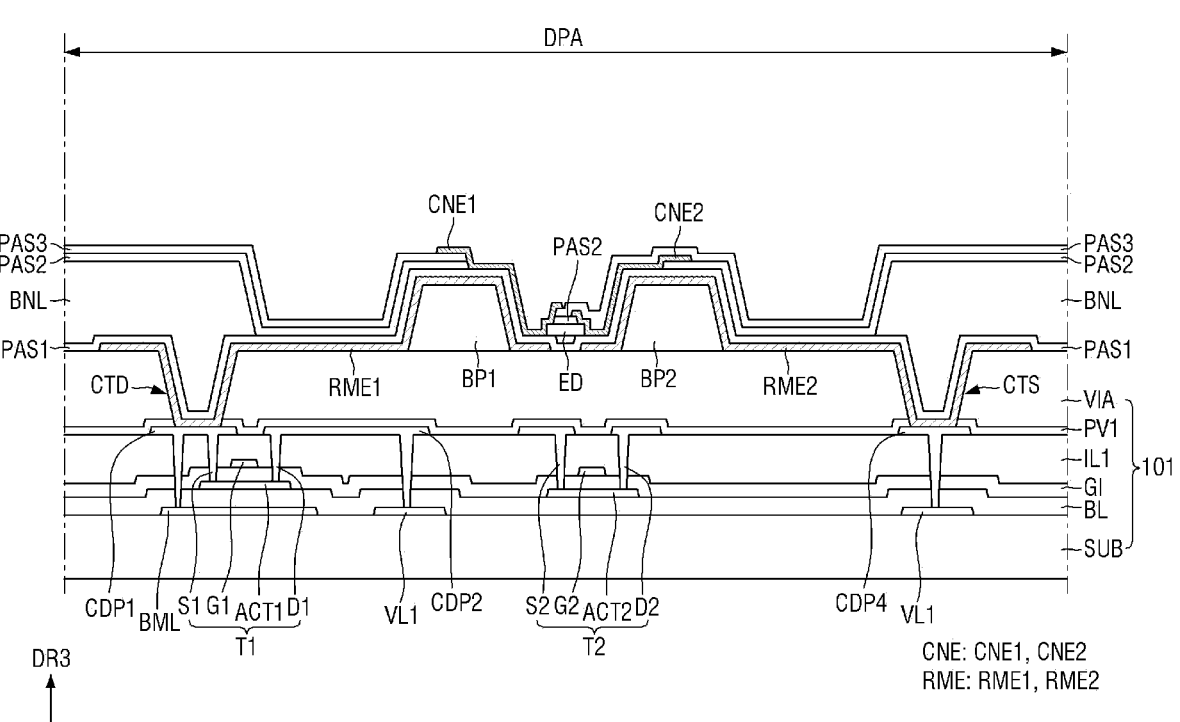
FIG. 23 is a schematic cross-sectional view of a portion of a display device according to an embodiment.

FIG. 23 is a schematic cross-sectional view of a portion of a display device 10 according to an embodiment.

Referring to FIG. 23, in the display device 10 according to the embodiment, each of a first voltage wiring VL1 and a second voltage wiring VL2 may be disposed in a first conductive layer, and a third conductive layer may further include a second conductive pattern CDP2 and a fourth conductive pattern CDP4. The embodiment is different from the embodiment of FIG. 5 in that the first voltage wiring VL1 and the second voltage wiring VL2 are disposed in the first conductive layer instead of the third conductive layer, and the second conductive pattern CDP2 and the fourth conductive pattern CDP4 electrically connecting the first voltage wiring VL1 and the second voltage VL2 to a first transistor T1 or a second electrode RME2 are further included.

Each of the first voltage wiring VL1 and the second voltage wiring VL2 may be disposed in the first conductive layer and may include a third metal layer ML3 including a copper alloy as described above. A detailed description of the first voltage wiring VL1 and the second voltage wiring VL2 is the same as the description provided with reference to FIG. 8.

The third conductive layer may include the second conductive pattern CDP2 electrically connected to the first voltage wiring VL1. The second conductive pattern CDP2 may serve as a first drain electrode D1 of a first transistor T1 and may be directly connected to the first voltage wiring VL1. The first voltage wiring VL1 may be electrically connected to the first transistor T1 through the second conductive pattern CDP2. The third conductive layer may include the fourth conductive pattern CDP4 electrically connected to the second voltage wiring VL2. The fourth conductive pattern CDP4 may be electrically connected to each of the second electrode RME2 and the second voltage wiring VL2, and the second electrode RME2 may be electrically connected to the second voltage wiring VL2 through the fourth conductive pattern CDP4.

Each of the second conductive pattern CDP2 and the fourth conductive pattern CDP4 may include a third metal layer ML3 including a copper alloy. A detailed description of the second conductive pattern CDP2 and the fourth conductive pattern CDP4 is the same as the description provided with reference to FIGS. 5 through 8.

Figure 24:
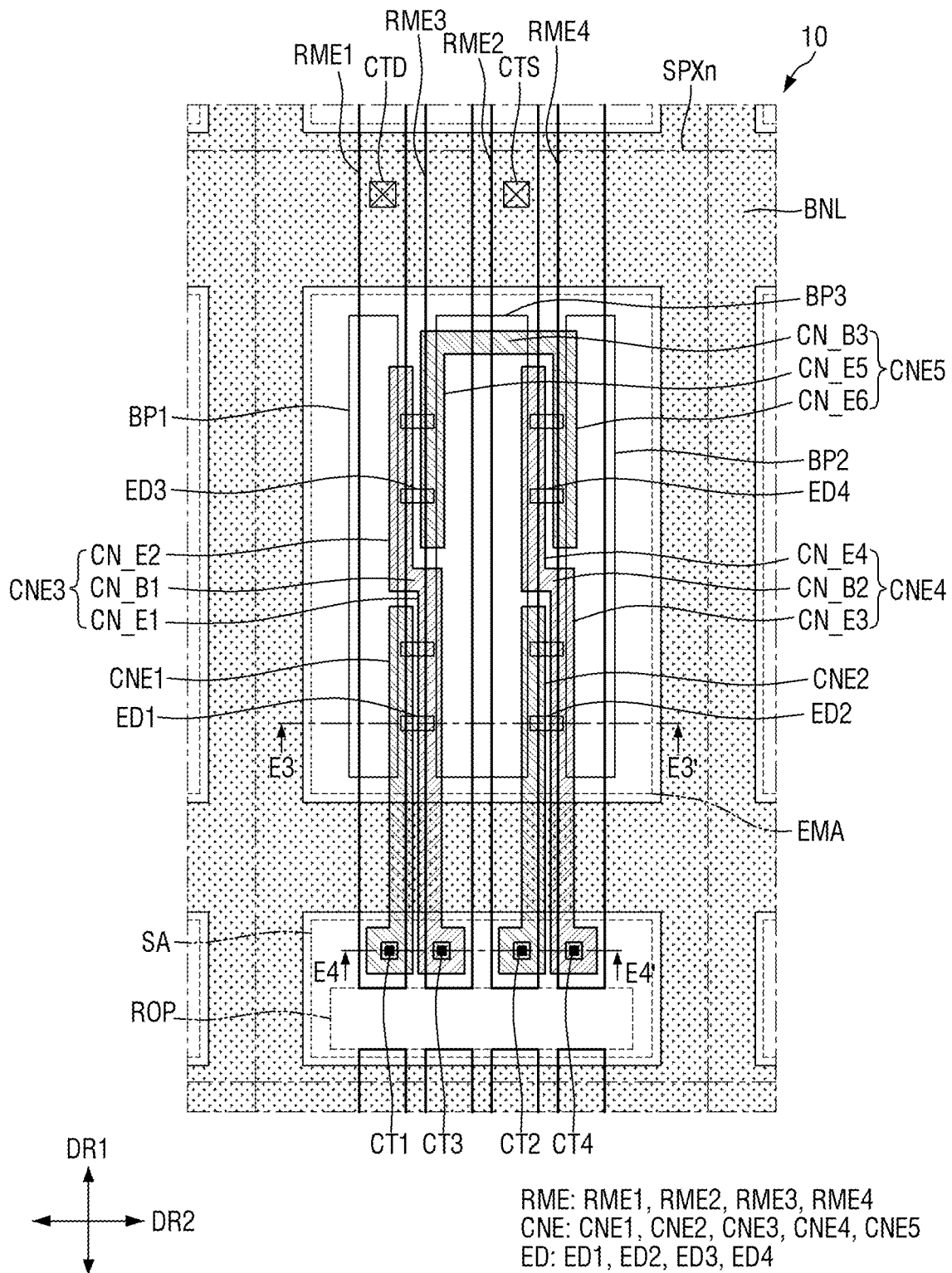
FIG. 24 is a plan view of a subpixel of a display device according to an embodiment.
Figure 25:
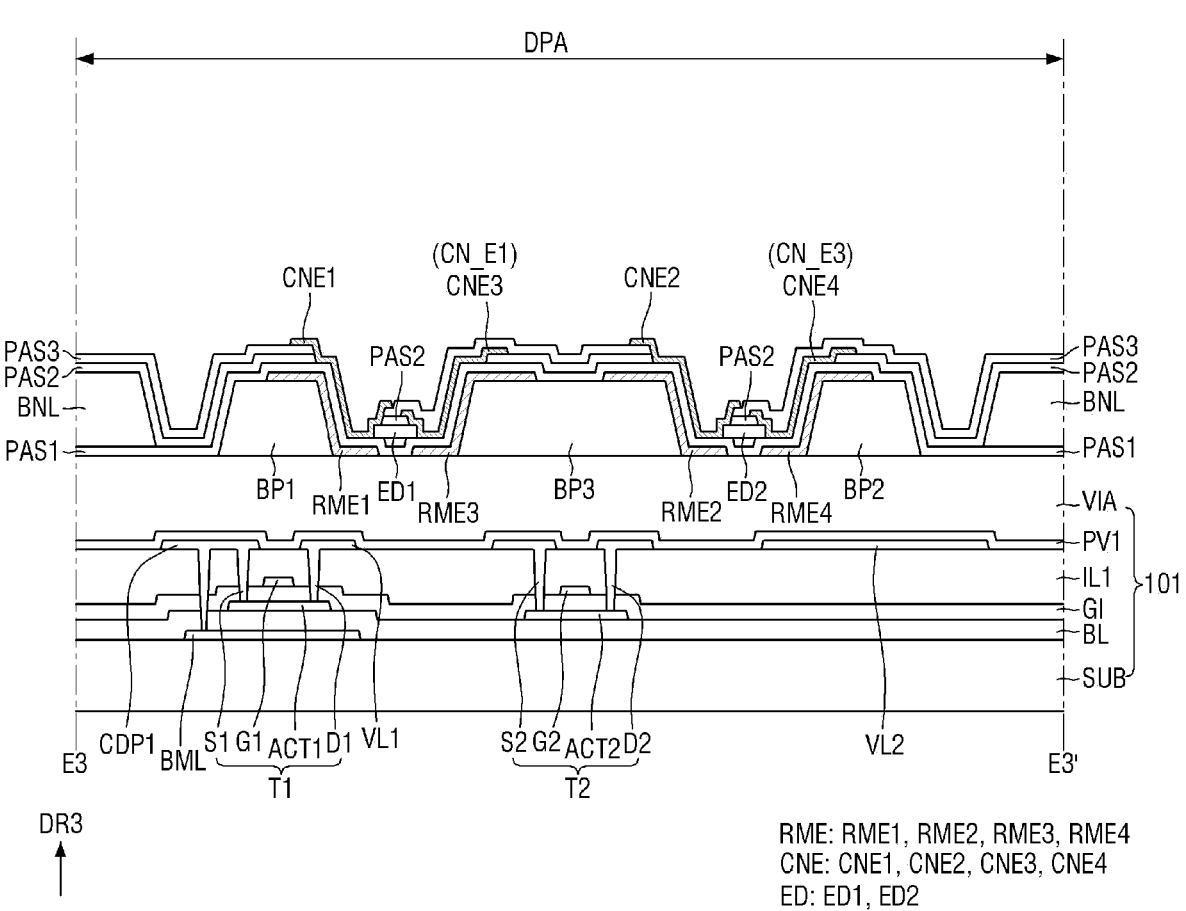
FIG. 25 is a schematic cross-sectional view taken along line E3-E3' of FIG. 24.
Figure 26:
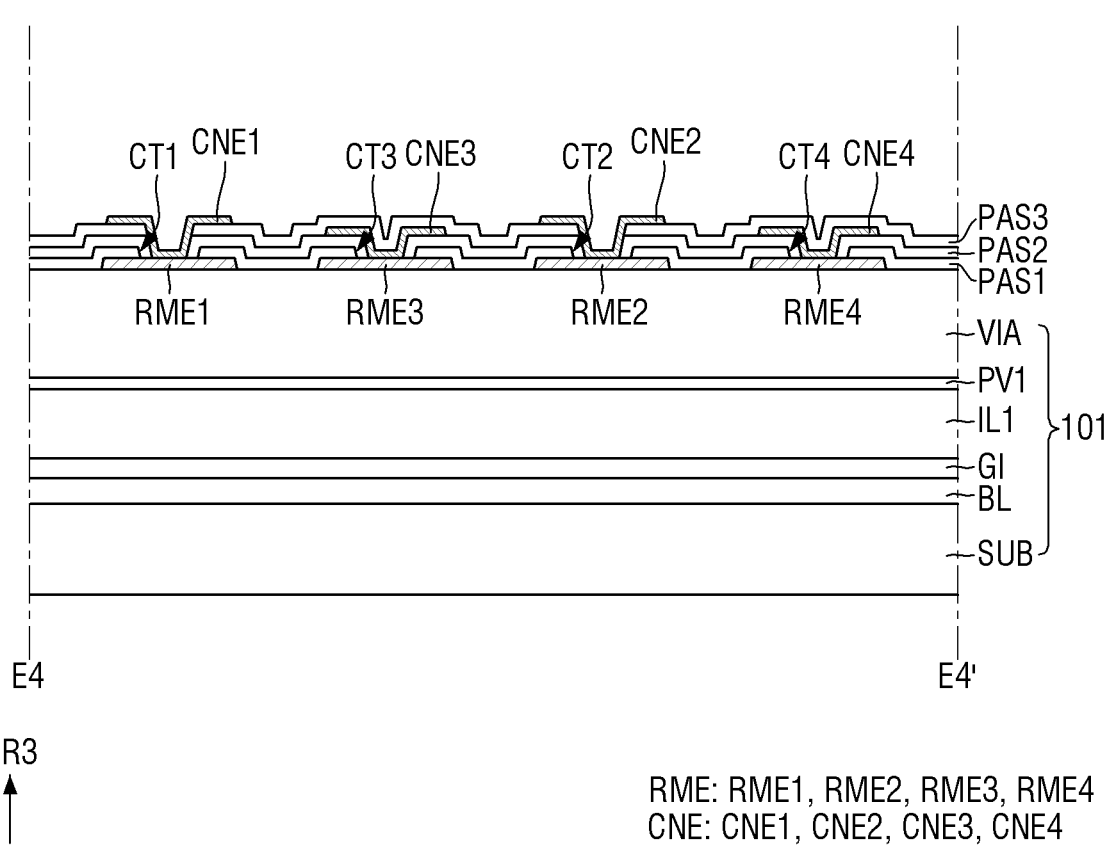
FIG. 26 is a schematic cross-sectional view taken along line E4-E4' of FIG. 24.

FIG. 24 is a plan view of a subpixel SPXn of a display device 10 according to an embodiment. FIG. 25 is a schematic cross-sectional view taken along line E3-E3' of FIG. 24. FIG. 26 is a schematic cross-sectional view taken along line E4-E4' of FIG. 24. FIG. 24 illustrates the planar arrangement of electrodes RME (RME1 through RME4), barrier walls BP1 through BP3, a bank layer BNL, multiple light emitting elements ED, and connection electrodes CNE (CNE1 through CNE5) in a subpixel SPXn of the display device 10. FIG. 25 illustrates a cross section across both ends of the light emitting elements ED (ED1 through ED4) disposed on different electrodes RME, and FIG. 26 illustrates a cross section across multiple contact portions CT1 through CT4.

Referring to FIGS. 24 through 26, the display device 10 according to the embodiment may include a greater number of the electrodes RME (RME1 through RME4), the barrier walls BP1 through BP3, the light emitting elements ED (ED1 through ED4), and the connection electrodes CNE (CNE1 through CNE5). The display device 10 according to the embodiment is different from that of the embodiment of FIG. 4 in that it includes a greater number of electrodes and light emitting elements in each subpixel SPXn. Therefore, any redundant description will be omitted, and differences will be described below.

The barrier walls BP1 through BP3 may further include a third barrier wall BP3 disposed between a first barrier wall BP1 and a second barrier wall BP2. The first barrier wall BP1 may be disposed on a left side of a center of an emission area EMA, the second barrier wall BP2 may be disposed on a right side of the center of the emission area EMA, and the third barrier wall BP3 may be disposed in the center of the emission area EMA. A width of the third barrier wall BP3 measured in the second direction DR2 may be greater than those of the first barrier wall BP1 and the second barrier wall BP2. A distance between the barrier walls BP1 through BP3 in the second direction DR2 may be greater than a distance between the electrodes RME. The first barrier wall BP1 may partially overlap a first electrode RME1, and the second barrier wall BP2 may partially overlap a fourth electrode RME4. The third barrier wall BP3 may partially overlap a second electrode RME2 and a third electrode RME3. At least a portion of each electrode RME may not overlap the barrier walls BP1 through BP3.

The electrodes RME disposed in each subpixel SPXn may include the third electrode RME3 and the fourth electrode RME4 in addition to the first electrode RME1 and the second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed between them. The electrodes RME may be sequentially disposed in the order of the first electrode RME1, the third electrode RME3, the second electrode RME2, and the fourth electrode RME4 from the left to the right of each subpixel SPXn. The electrodes RME may be spaced apart to face each other in the second direction DR2. The electrodes RME may be spaced apart from the electrodes RME of adjacent subpixel SPXn in the first direction DR1 in a separation portion ROP of a sub-area SA.

The first electrode RME1 and the second electrode RME2 among the electrodes RME may respectively electrically contact a first conductive pattern CDP1 and a second voltage wiring VL2 thereunder through electrode contact holes CTD and CTS disposed under the bank layer BNL, but the third electrode RME3 and the fourth electrode RME4 may not.

A first insulating layer PAS1 may be disposed in a structure similar to those of the above-described embodiments. The first insulating layer PAS1 may be disposed in the entire display area DPA and may cover the electrodes RME and the barrier walls BP1 through BP3.

The light emitting elements ED may be disposed between the barrier walls BP1 through BP3 and may be disposed on different electrodes RME. Some of the light emitting elements ED may be disposed between the first barrier wall BP1 and the third barrier wall BP3, and the others may be disposed between the third barrier wall BP3 and the second barrier wall BP2. According to an embodiment, the light emitting elements ED may include first light emitting elements ED1 and third light emitting elements ED3 disposed between the first barrier wall BP1 and the third barrier wall BP3 and second light emitting elements ED2 and fourth light emitting elements ED4 disposed between the third barrier wall BP3 and the second barrier wall BP2. Each of the first light emitting elements ED1 and the third light emitting elements ED3 may be disposed on the first electrode RME1 and the third electrode RME3, and each of the second light emitting elements ED2 and the fourth light emitting elements ED4 may be disposed on the second electrode RME2 and the fourth electrode RME4. The first light emitting elements ED1 and the second light emitting elements ED2 may be disposed in the emission area EMA of a corresponding subpixel SPXn adjacent to a lower side or the sub-area SA, and the third light emitting elements ED3 and the fourth light emitting elements ED4 may be disposed in the emission area EMA of the corresponding subpixel SPXn adjacent to an upper side.

However, the light emitting elements ED are not classified according to their position in the emission area EMA but may be classified according to their connection relationship with the connection electrodes CNE which will be described later. Both ends of each light emitting element ED may electrically contact different connection electrodes CNE according to the arrangement structure of the connection electrodes CNE, and the light emitting elements ED may be classified into different light emitting elements ED according to types of the connection electrodes CNE that they electrically contact.

The connection electrodes CNE may include a third connection electrode CNE3, a fourth connection electrode CNE4, and a fifth connection electrode CNE5 disposed over multiple electrodes RME in addition to a first connection electrode CNE1 disposed on the first electrode RME1 and a second connection electrode CNE2 disposed on the second electrode RME2.

Unlike the embodiment of FIGS. 4 through 6, each of the first connection electrode CNE1 and the second connection electrode CNE2 may have a relatively short length in the first direction DR1. The first connection electrode CNE1 and the second connection electrode CNE2 may be disposed below the center of the emission area EMA. The first connection electrode CNE1 and the second connection electrode CNE2 may be disposed over the emission area EMA and the sub-area SA of a corresponding subpixel SPXn and may respectively directly contact the electrodes RME through the contact portions CT1 and CT2 formed in the sub-area SA. The first connection electrode CNE1 may directly contact the first electrode RME1 through a first contact portion CT1 penetrating the first insulating layer PAS1, a second insulating layer PAS2, and a third insulating layer PAS3 in the sub-area SA, and the second connection electrode CNE2 may directly contact the second electrode RME2 through a second contact portion CT2 penetrating the first insulating layer PAS1, the second insulating layer PAS2, and the third insulating layer PAS3 in the sub-area SA.

The third connection electrode CNE3 may include a first extension portion CN_E1 disposed on the third electrode RME3, a second extension portion CN_E2 disposed on the first electrode RME1, and a first connection portion CN_B1 connecting the first extension portion CN_E1 and the second extension portion CN_E2. The first extension portion CN_E1 may be spaced apart from the first connection electrode CNE1 in the second direction DR2 to face the first connection electrode CNE1, and the second extension portion CN_E2 may be spaced apart from the first connection electrode CNE1 in the first direction DR1. The first extension portion CN_E1 may be disposed on the lower side of the emission area EMA of a corresponding subpixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the third electrode RME3 in the center of the emission area EMA. The third connection electrode CNE3 may generally extend in the first direction DR1 but may be bent in the second direction DR2 and may extend again in the first direction DR1.

The fourth connection electrode CNE4 may include a third extension portion CN_E3 disposed on the fourth electrode RME4, a fourth extension portion CN_E4 disposed on the second electrode RME2, and a second connection portion CN_B2 connecting the third extension portion CN_E3 and the fourth extension portion CN_E4. The third extension portion CN_E3 may be spaced apart from the second connection electrode CNE2 in the second direction DR2 to face the second connection electrode CNE2, and the fourth extension portion CN_E4 may be spaced apart from the second connection electrode CNE2 in the first direction DR1. The third extension portion CN_E3 may be disposed on the lower side of the emission area EMA of a corresponding subpixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 at a position adjacent to the center of the emission area EMA. The fourth connection electrode CNE4 may generally extend in the first direction DR1 but may be bent in the second direction DR2 and may extend again in the first direction DR1.

The fifth connection electrode CNE5 may include a fifth extension portion CN_E5 disposed on the third electrode RME3, a sixth extension portion CN_E6 disposed on the fourth electrode RME4, and a third connection portion CN_B3 connecting the fifth extension portion CN_E5 and the sixth extension portion CN_E6. The fifth extension portion CN_E5 may be spaced apart from the second extension portion CN_E2 of the third connection electrode CNE3 in the second direction DR2 to face the second extension portion CN_E2, and the sixth extension portion CN_E6 may be spaced apart from the fourth extension portion CN_E4 of the fourth connection electrode CNE4 in the second direction DR2 to face the fourth extension portion CN_E4. Each of the fifth extension portion CN_E5 and the sixth extension portion CN_E6 may be disposed on the upper side of the emission area EMA, and the third connection portion CN_B3 may be disposed across the third electrode RME3, the second electrode RME2 and the fourth electrode RME4. The fifth connection electrode CNE5 may surround the fourth extension portion CN_E4 of the fourth connection electrode CNE4 in a plan view.

The third connection electrode CNE3 may directly contact the third electrode RME3 through a third contact portion CT3 penetrating the first insulating layer PAS1 and the second insulating layer PAS2 in the sub-area SA, and the fourth connection electrode CNE4 may directly contact the fourth electrode RME4 through a fourth contact portion CT4 penetrating the first insulating layer PAS1 and the second insulating layer PAS2 in the sub-area SA.

However, the disclosure is not limited thereto. In some embodiments, in the display device 10, some of the connection electrodes CNE may be directly connected to a third conductive layer. For example, each of the first connection electrode CNE1 and the second connection electrode CNE2 which are first type connection electrodes may be directly connected to the third conductive layer and may not be directly connected to the electrodes RME. A second type connection electrode and a third type connection electrode may also not be directly connected to the electrodes RME and may be electrically connected only to the light emitting elements ED.

The first connection electrode CNE1 and the second connection electrode CNE2 may be first type connection electrodes electrically connected to the electrodes RME1 and RME2 directly connected to the third conductive layer. The third connection electrode CNE3 and the fourth connection electrode CNE4 may be second type connection electrodes electrically connected to the electrodes RME3 and RME4 not electrically connected to the third conductive layer. The fifth connection electrode CNE5 may be a third type connection electrode not electrically connected to the electrodes RME. The fifth connection electrode CNE5 may not be electrically connected to the electrodes RME but may contact the light emitting elements ED and may form an electrical connection circuit of the light emitting elements ED together with other connection electrodes CNE.

The third connection electrode CNE3 and the fourth connection electrode CNE4 which are second type connection electrodes may be connection electrodes in which electrode extension portions extending in the first direction DR1 are not adjacent to each other in the second direction DR2, and the fifth connection electrode CNE5 which is a third type connection electrode may be a connection electrode in which electrode extension portions extending in the first direction DR1 are adjacent to each other in the second direction DR2. The third connection electrode CNE3 and the fourth connection electrode CNE4 may extend in the first direction DR1 and may be bent, and the fifth connection electrode CNE5 may surround a portion of another connection electrode.

In the above arrangement structure of the connection electrodes CNE, the light emitting elements ED may be classified into different light emitting elements ED according to the connection electrodes CNE that both ends thereof electrically contact. Each of the first light emitting elements ED1 and the second light emitting elements ED2 may have a first end electrically contacting a first type connection electrode and a second end electrically contacting a second type connection electrode. The first light emitting elements ED1 may electrically contact the first connection electrode CNE1 and the third connection electrode CNE3, and the second light emitting elements ED2 may electrically contact the second connection electrode CNE2 and the fourth connection electrode CNE4. Each of the third light emitting elements ED3 and the fourth light emitting elements ED4 may have a first end electrically contacting a second type connection electrode and a second end electrically contacting a third type connection electrode. The third light emitting elements ED3 may electrically contact the third connection electrode CNE3 and the fifth connection electrode CNE5, and the fourth light emitting elements ED4 may electrically contact the fourth connection electrode CNE4 and the fifth connection electrode CNE5.

The light emitting elements ED may be electrically connected to each other in series through the connection electrodes CNE. Since the display device 10 according to the embodiment includes a greater number of the light emitting elements ED in each subpixel SPXn and forms a series connection of the light emitting elements ED, the amount of light emitted per unit area may be further increased.

Figure 27:
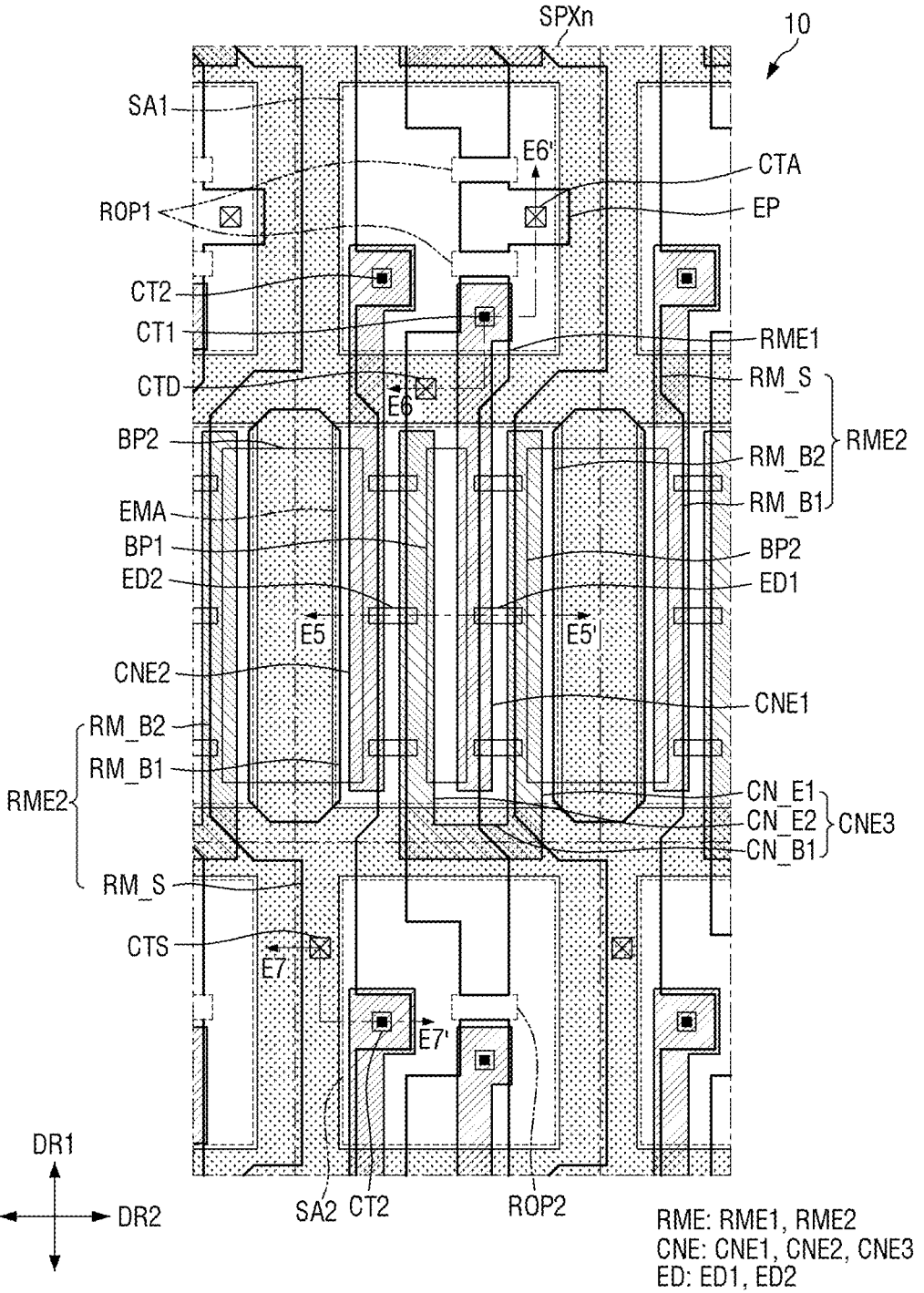
FIG. 27 is a plan view of a subpixel of a display device according to an embodiment.
Figure 28:
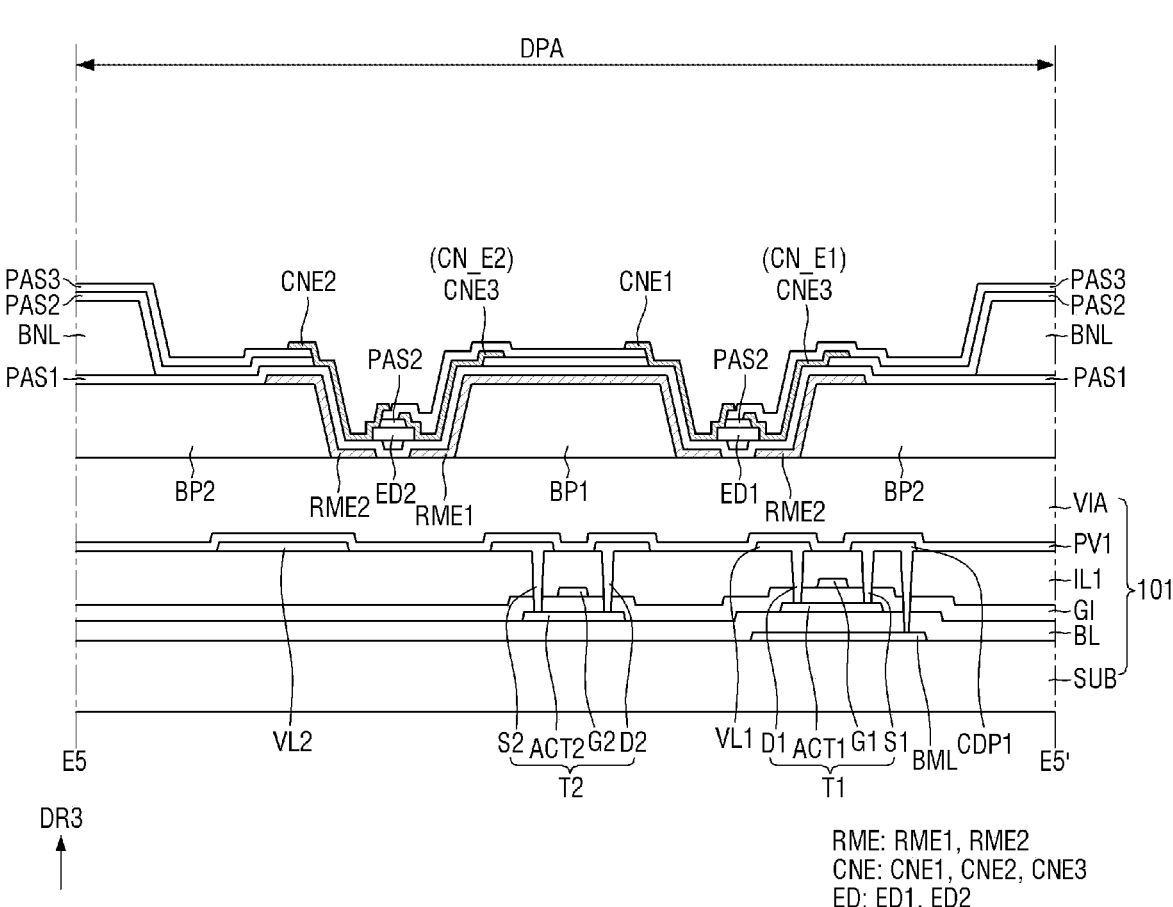
FIG. 28 is a schematic cross-sectional view taken along line E5-E5' of FIG. 27.
Figure 29:
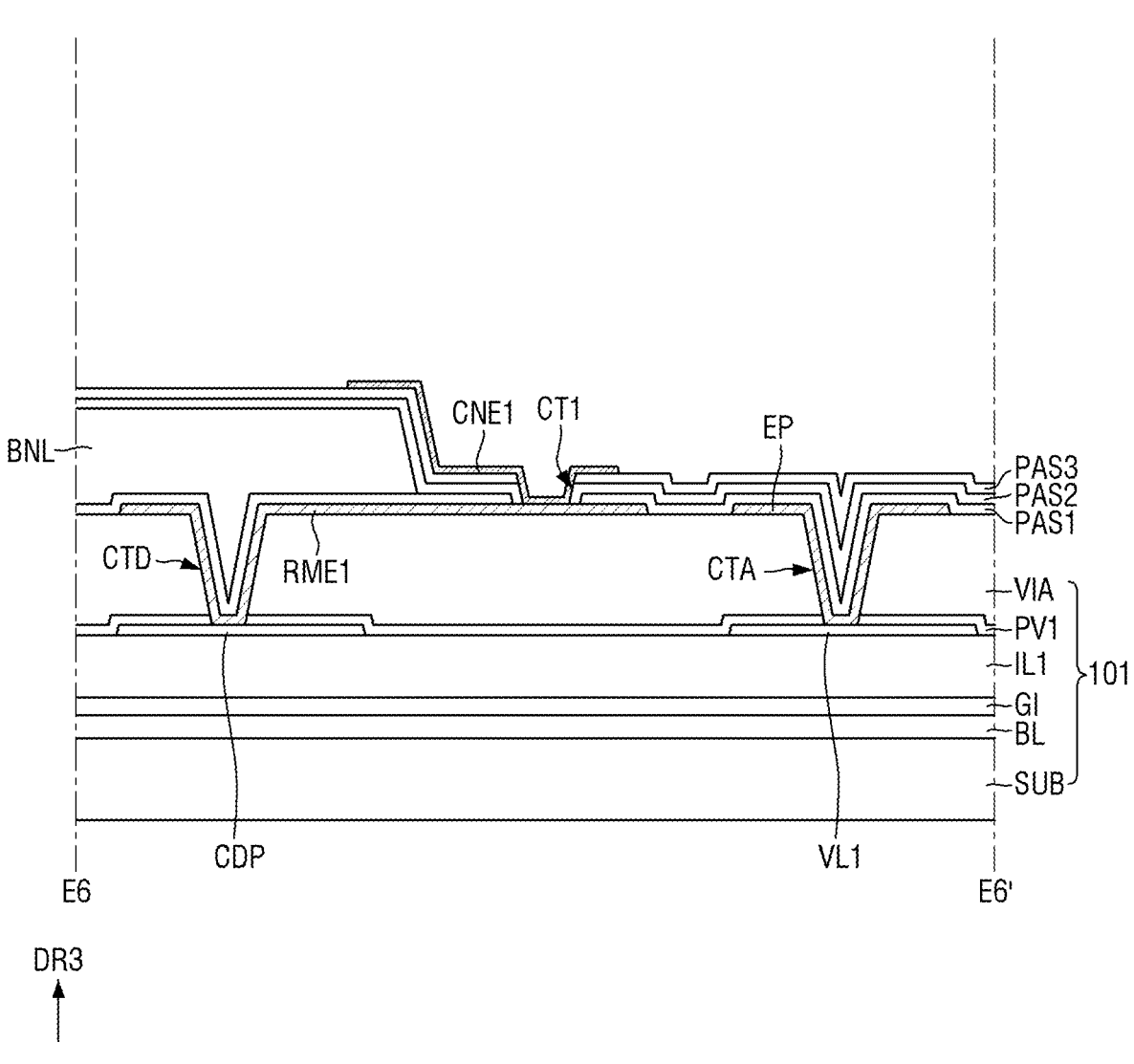
FIG. 29 is a schematic cross-sectional view taken along line E6-E6' of FIG. 27.
Figure 30:
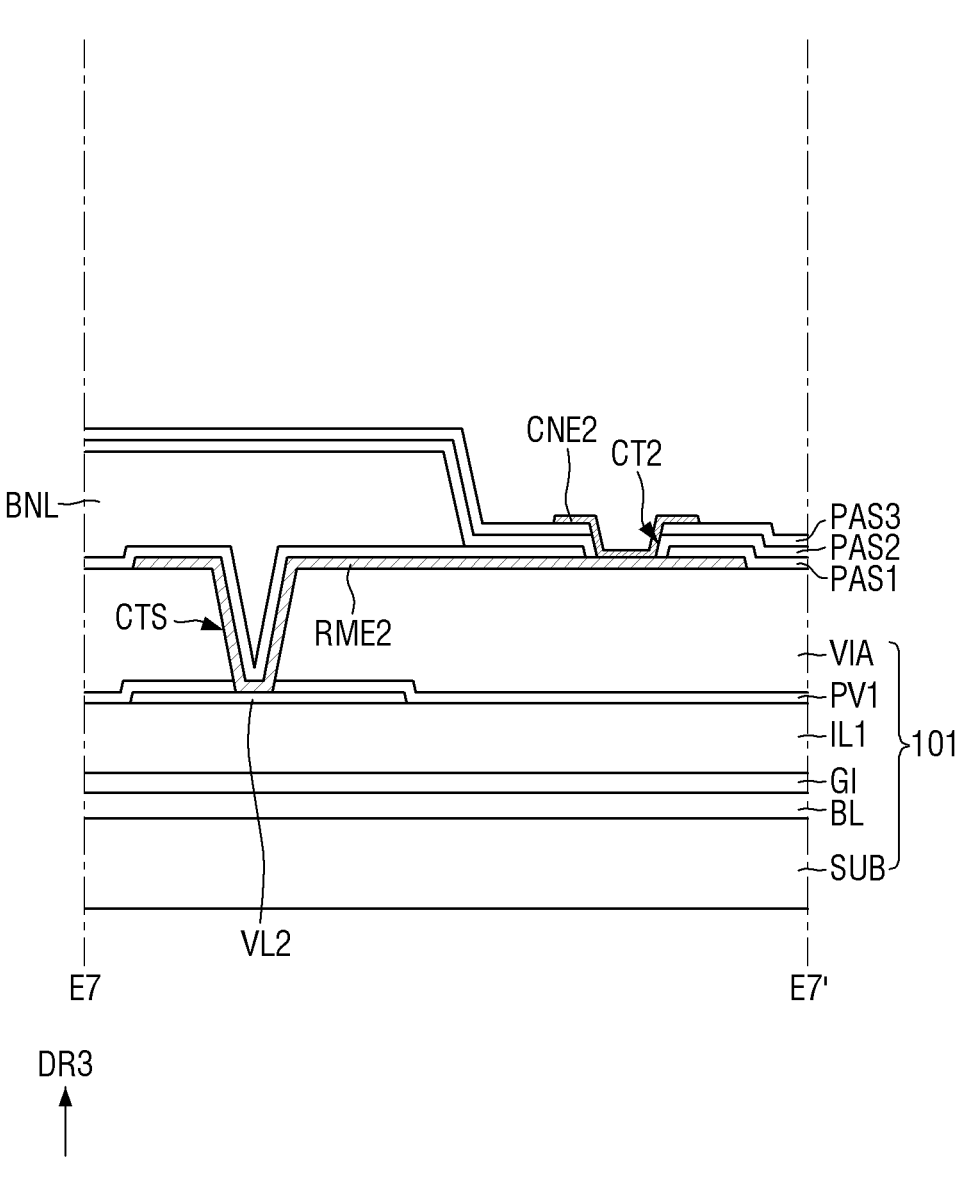
FIG. 30 is a schematic cross-sectional view taken along line E7-E7' of FIG. 27.

FIG. 27 is a plan view of a subpixel SPXn of a display device 10 according to an embodiment. FIG. 28 is a schematic cross-sectional view taken along line E5-E5' of FIG. 27. FIG. 29 is a schematic cross-sectional view taken along line E6-E6' of FIG. 27. FIG. 30 is a schematic cross-sectional view taken along line E7-E7' of FIG. 27.

FIG. 27 illustrates the planar arrangement of electrodes RME (RME1 and RME2), barrier walls BP1 and BP2, a bank layer BNL, multiple light emitting elements ED, and connection electrodes CNE (CNE1 through CNE3) in a subpixel SPXn of the display device 10. FIG. 28 illustrates a cross section across both ends of the light emitting elements ED (ED1 and ED2) disposed on different electrodes RME, and FIGS. 29 and 30 illustrate cross sections across multiple electrode contact holes CTD, CTS and CTA and multiple contact portions CT1 and CT2.

Referring to FIGS. 27 through 30, the display device 10 according to the embodiment may be different from those of the above-described embodiments in the structure of the electrodes RME, the connection electrodes CNE, and the barrier walls BP1 and BP2. Therefore, any redundant description already provided in the above embodiments will be omitted, and differences will be described below.

The barrier walls BP1 and BP2 may extend in the first direction DR1 but may have different widths in the second direction DR2. One of the barrier walls BP1 and BP2 may be disposed over neighboring subpixels SPXn in the second direction DR2. For example, the barrier walls BP1 and BP2 may include a first barrier wall BP1 disposed in an emission area EMA of each subpixel SPXn and a second barrier wall BP2 disposed over the emission areas EMA of different subpixels SPXn.

The first barrier wall BP1 may be disposed in a center of the emission area EMA, and the second barrier walls BP2 are spaced apart from each other with the first barrier wall BP1 interposed between them. The first barrier wall BP1 and the second barrier wall BP2 may be alternately disposed in the second direction DR2. The light emitting elements ED may be disposed between the first barrier wall BP1 and the second barrier wall BP2 spaced apart from each other.

The first barrier wall BP1 and the second barrier wall BP2 may have the same length in the first direction DR1 and may have different widths measured in the second direction DR2. A portion of the bank layer BNL which extends in the first direction DR1 may overlap the second barrier wall BP2 in the thickness direction. The first barrier wall BP1 may overlap a first electrode RME1, and the second barrier wall BP2 may overlap electrode branch portions RM_B1 and RM_B2 of a second electrode RME2 and the bank layer BNL. The barrier walls BP1 and BP2 may be disposed as island-shaped patterns throughout display area DPA.

The electrodes RME may include the first electrode RME1 disposed in a center of each subpixel SPXn and the second electrode RME2 disposed over different subpixels SPXn. The first electrode RME1 and the second electrode RME2 may generally extend in the first direction DR1, and portions disposed in the emission area EMA may have different shapes.

The first electrode RME1 may be disposed in the center of each subpixel SPXn, and a portion disposed in the emission area EMA may be disposed on the first barrier wall BP1. The first electrode RME1 may extend in the first direction DR1 from a sub-area SA to the sub-area SA of adjacent sub-pixel SPXn in the first direction. A width of the first electrode RME1 in the second direction DR2 may vary according to position, and at least a portion overlapping the first barrier wall BP1 in the emission area EMA may have a greater width than the first barrier wall BP1.

The second electrode RME2 may include a portion extending in the first direction DR1 and portions branching in the vicinity of the emission area EMA. In an embodiment, the second electrode RME2 may include an electrode stem portion RM_S extending in the first direction DR1 and multiple electrode branch portions RM_B1 and RM_B2 branching from the electrode stem portion RM_S, bending in the second direction DR2, and extending in the first direction DR1. The electrode stem portion RM_S may overlap a portion of the bank layer BNL which extends in the first direction DR1 and may be disposed on a side of the sub-area SA in the second direction DR2. The electrode branch portions RM_B1 and RM_B2 may branch from the electrode stem portion RM_S disposed in a portion of the bank layer BNL which extends in the first direction DR1 and a portion of the bank layer BNL which extends in the second direction DR2 and may be bent to both sides in the second direction DR2. The electrode branch portions RM_B1 and RM_B2 may extend across the emission area EMA in the first direction DR1 and may be bent again to be connected to the electrode stem portion RM_S. For example, the electrode branch portions RM_B1 and RM_B2 of the second electrode RME2 may branch off on an upper side of the emission area EMA of a subpixel SPXn and may be connected to each other again on a lower side of the emission area EMA.

The second electrode RME2 may include a first electrode branch portion RM_B1 disposed on a left side of the first electrode RME1 and a second electrode branch portion RM_B2 disposed on a right side of the first electrode RME1. The electrode branch portions RM_B1 and RM_B2 included in a second electrode RME2 may be respectively disposed in the emission areas EMA of neighboring subpixels SPXn in the second direction DR2, and the electrode branch portions RM_B1 and RM_B2 of different second electrodes RME2 may be disposed in a subpixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

Each of the electrode branch portions RM_B1 and RM_B2 of the second electrode RME2 may overlap a side of the second barrier wall BP2. The first electrode branch portion RM_B1 may partially overlap the second barrier wall BP2 disposed on a left side of the first barrier wall BP1, and the second electrode branch portion RM_B2 may partially overlap the second barrier wall BP2 disposed on a right side of the first barrier wall BP1. Both sides of the first electrode RME1 may be spaced apart from another electrode branch portions RM_B1 and RM_B2 of another second electrodes RME2 to face them, and a distance between the first electrode RME1 and each of the electrode branch portions RM_B1 and RM_B2 may be smaller than a distance between different barrier walls BP1 and BP2.

A width of the first electrode RME1 measured in the second direction DR2 may be greater than widths of the electrode stem portion RM_S and the electrode branch portions RM_B1 and RM_B2 of the second electrode RME2. The first electrode RME1 may have a greater width than the first barrier wall BP1 to overlap both sides of the first barrier wall BP1, and the second electrode RME2 may have a relatively small width so that each of the electrode branch portions RM_B1 and RM_B2 overlaps only one side of the second barrier wall BP2.

The first electrode RME1 may electrically contact a first conductive pattern CDP1 of a third conductive layer through a first electrode contact hole CTD in a portion overlapping a portion of the bank layer BNL which extends in the second direction DR2. The second electrode RME2 may electrically contact a second voltage wiring VL2 of the third conductive layer through a second electrode contact hole CTS in the electrode stem portion RM_S. A portion of the first electrode RME1 which is disposed in the sub-area SA may overlap a first contact portion CT1. The second electrode RME2 may include a portion protruding from the electrode stem portion RM_S in the second direction DR2 to be disposed in the sub-area SA and may overlap a second contact portion CT2 in the protruding portion.

The first electrode RME1 among the first electrode RME1 and the second electrode RME2 may extend to separation portions ROP1 and ROP2 of the sub-areas SA, and the second electrode RME2 may not be separated in the sub-areas SA. A second electrode RME2 may include multiple electrode stem portions RM_S and multiple electrode branch portions RM_B1 and RM_B2 to extend in the first direction DR1 and may branch in the vicinity of the emission area EMA of each subpixel SPXn. The first electrode RME1 may be disposed between the separation portions ROP1 and ROP2 disposed in different sub-areas SA1 and SA2 of adjacent subpixel SPXn and may be disposed across the emission area EMA.

According to an embodiment, the display device 10 may include a wiring connection electrode EP disposed in a first sub-area SA1 among multiple sub-areas SA1 and SA2 of a subpixel SPXn and disposed between the first electrodes RME1 of adjacent subpixels SPXn. The wiring connection electrode EP may not be disposed in a second sub-area SA2 of a subpixel SPXn, and the first electrodes RME1 of adjacent subpixels SPXn in the first direction DR1 may be spaced apart from each other in the second sub-area SA2. In the subpixel SPXn illustrated in FIG. 27 among multiple subpixels SPXn, the first sub-area SA1 in which the wiring connection electrode EP is disposed may be disposed above the emission area EMA, and the second sub-area SA2 may be disposed below the emission area EMA. On the other hand, in a subpixel SPXn adjacent to the subpixel SPXn of FIG. 27 in the first direction DR1, the first sub-area SA1 in which the wiring connection electrode EP is disposed may be disposed below the emission area EMA, and the second sub-area SA2 may be disposed above the emission area EMA.

The first electrode RME1 may be spaced apart from the wiring connection electrode EP with a first separation portion ROP1 interposed between them in the first sub-area SA1. Two first separation portions ROP1 may be disposed in a first sub-area SA1. The wiring connection electrode EP may be spaced apart from the first electrode RME1 disposed in a corresponding subpixel SPXn with a lower first separation portion ROP1 interposed between them and may be spaced apart from the first electrode RME1 disposed in another subpixel SPXn with an upper first separation portion ROP interposed between them. In the second sub-area SA2, one second separation portion ROP2 may be disposed, and different first electrodes RME1 may be spaced apart from each other in the first direction DR1.

In an embodiment, the wiring connection electrode EP may be electrically connected to a first voltage wiring VL1 of the third conductive layer through a third electrode contact hole CTA penetrating a via layer VIA. The first electrode RME1 may be electrically connected to the wiring connection electrode EP, and an electrical signal transmitted to place the light emitting elements ED may be transmitted from the first voltage wiring VL1 to the first electrode RME1 through the wiring connection electrode EP. In the process of placing the light emitting elements ED, signals may be transmitted to the first voltage wiring VL1 and the second voltage wiring VL2 and may be transferred to the first electrode RME1 and the second electrode RME2, respectively.

The relative position of the second electrode contact hole CTS may be different from that of the third electrode contact hole CTA to be described later. The second electrode contact hole CTS may be disposed in the bank layer BNL which surrounds the second sub-area SA2, and the third electrode contact hole CTA may be disposed in the first sub-area SA1. For example, since the second electrode contact hole CTS and the third electrode contact hole CTA expose upper surfaces of the voltage wirings VL1 and VL2, respectively, the position of each of the second electrode contact hole CTS and the third electrode contact hole CTA may be determined accordingly.

The bank layer BNL may surround the emission area EMA and the sub-areas SA1 and SA2 as in the above-described embodiments. However, in an embodiment in which the display device 10 includes the sub-areas SA1 and SA2 separated from each other, the areas surrounded by the bank layer BNL may be separated from each other. The bank layer BNL may be the same as those of the above-described embodiments except that it surrounds the sub-areas SA1 and SA2 different from each other.

The light emitting elements ED may be disposed on different electrodes RME between different barrier walls BP1 and BP2. The light emitting elements ED may include first light emitting elements ED1 having both ends disposed on the first electrode RME1 and the second electrode branch portion RM_B2 of the second electrode RME2 respectively and second light emitting elements ED2 having both ends disposed on the first electrode RME1 and the first electrode branch portion RM_B1 of another second electrode RME2 respectively. The first light emitting elements ED1 may be disposed on the right side of the first electrode RME1, and the second light emitting elements ED2 may be disposed on the left side of the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (CNE1 through CNE3) may include a first connection electrode CNE1, a second connection electrode CNE2, and a third connection electrode CNE3.

The first connection electrode CNE1 may extend in the first direction DR1 and may be disposed on the first electrode RME1. A portion of the first connection electrode CNE1 which is disposed on the first barrier wall BP1 may overlap the first electrode RME1 and may extend in the first direction DR1 from the emission area EMA to the first sub-area SA1 located above the emission area EMA through the bank layer BNL. The first connection electrode CNE1 may electrically contact the first electrode RME1 through the first contact portion CT1 in the first sub-area SA1.

The second connection electrode CNE2 may extend in the first direction DR1 and may be disposed on the second electrode RME2. A portion of the second connection electrode CNE2 which is disposed on the second barrier wall BP2 may overlap the second electrode RME2 and may extend in the first direction DR1 from the emission area EMA to the first sub-area SA1 located above the emission area EMA through the bank layer BNL. The second connection electrode CNE2 may electrically contact the second electrode RME2 through the second contact portion CT2 in the first sub-area SA1.

In a subpixel SPXn adjacent to the subpixel SPXn of FIG. 27 in the first direction DR1, the first connection electrode CNE1 and the second connection electrode CNE2 may respectively electrically contact the first electrode RME1 and the second electrode RME2 through the contact portions CT1 and CT2 disposed in the second sub-area SA2.

The third connection electrode CNE3 may include extension portions CN_E1 and CN_E2 extending in the first direction DR1 and a first connection portion CN_B1 connecting the extension portions CN_E1 and CN_E2. A first extension portion CN_E1 may face the first connection electrode CNE1 in the emission area EMA and may be disposed on the second electrode branch portion RM_B2 of the second electrode RME2. A second extension portion CN_E2 may face the second connection electrode CNE2 in the emission area EMA and may be disposed on the first electrode RME1. The first connection portion CN_B1 may extend in the second direction DR2 on the bank layer BNL disposed below the emission area EMA and may connect the first extension portion CN_E1 and the second extension portion CN_E2. The third connection electrode CNE3 may be disposed in the emission area EMA and on the bank layer BNL and may not be directly connected to the electrodes RME. The second electrode branch portion RM_B2 disposed under the first extension portion CN_E1 may be electrically connected to the second voltage wiring VL2, and a second power supply voltage applied to the second electrode branch portion RM_B2 may not be transmitted to the third connection electrode CNE3.

In a wiring substrate according to an embodiment, wirings and conductive patterns of multiple conductive layers may have a smooth surface and improved straightness by including a metal capping layer made of a copper alloy having a small grain size.

In a display device including the above wiring substrate according to an embodiment, a step coverage defect of an insulating layer disposed between conductive layers can be reduced, and short circuit and burnt defects between wirings can be prevented.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display area and a pad area disposed on a side of the display area;
a plurality of conductive layers disposed on a first substrate in the display area and the pad area and comprising a wiring and a conductive pattern;
a via layer disposed on the plurality of conductive layers;
a plurality of electrodes disposed on the via layer in the display area and spaced apart from each other; and
a light emitting element disposed on at least one of the plurality of electrodes, wherein
at least one of the plurality of conductive layers comprises:
a first metal layer;
a second metal layer disposed on the first metal layer; and
a third metal layer disposed on the second metal layer,
the second metal layer comprises copper (Cu),
the third metal layer comprises a copper alloy, and
a grain size of the third metal layer is smaller than a grain size of the second metal layer.

2. The display device of claim 1, wherein the third metal layer comprises:
a main component comprising copper; and
an impurity metal comprising at least one of silver (Ag), magnesium (Mg), aluminum (Al), indium (In), niobium (Nb), and boron (B).

3. The display device of claim 2, wherein
the first metal layer comprises titanium (Ti), and
the second metal layer comprises pure copper (Cu).

4. The display device of claim 1, wherein the grain size of the third metal layer is a quarter or less of the grain size of the second metal layer.

5. The display device of claim 1, wherein a thickness of the third metal layer is smaller than a thickness of the second metal layer.

6. The display device of claim 5, wherein the thickness of the third metal layer is about 100 Å or more.

7. The display device of claim 5, wherein
a thickness of the first metal layer is in a range of about 200 Å to about 500 Å, and
the thickness of the second metal layer is in a range of about 3000 Å to about 17000 Å.

8. The display device of claim 1, wherein
each of the wiring and the conductive pattern comprises the first metal layer, the second metal layer, and the third metal layer, and
a line edge roughness (LER) value of each of the wiring and the conductive pattern is about 0.195 μm or less.

9. The display device of claim 1, wherein
the plurality of conductive layers comprise:
a first conductive layer comprising a bottom metal layer disposed in the display area and a first pad wiring disposed in the pad area;
a second conductive layer disposed on the first conductive layer and comprising a plurality of gate electrodes disposed in the display area and a second pad wiring disposed in the pad area; and
a third conductive layer disposed on the second conductive layer and comprising a first conductive pattern disposed in the display area and a pad electrode lower layer disposed in the pad area, the via layer is disposed on the third conductive layer in the display area, and the display device further comprising:

a pad electrode upper layer disposed on the pad electrode lower layer in the pad area; and a pad electrode capping layer disposed on the pad electrode upper layer.

10. The display device of claim 9, further comprising:

a gate insulating layer disposed between the first conductive layer and the second conductive layer;

a first interlayer insulating layer disposed between the second conductive layer and the third conductive layer; and a first passivation layer disposed on the third conductive layer, wherein each of the gate insulating layer, the first interlayer insulating layer, and the first passivation layer comprises an inorganic insulating material.

11. The display device of claim 10, wherein the plurality of conductive layers further comprise a fourth conductive layer disposed on the third conductive layer and comprising a first voltage wiring and a second voltage wiring, and the display device further comprises:

a second interlayer insulating layer disposed on the first passivation layer; and a second passivation layer disposed on the fourth conductive layer.

12. The display device of claim 11, wherein the via layer comprises a trench portion exposing a portion of an upper surface of the second passivation layer, the plurality of electrodes comprise a first electrode and a second electrode spaced apart from the first electrode, at least a portion of each of the first electrode and the second electrode is directly disposed on the second passivation layer in the trench portion, and the light emitting element is disposed in the trench portion.

13. The display device of claim 9, wherein the plurality of electrodes comprise a first electrode and a second electrode spaced apart from the first electrode, and the display device further comprises:

a first insulating layer disposed on the first electrode and the second electrode;

a first connection electrode disposed on the first electrode and electrically contacting the light emitting element; and a second connection electrode disposed on the second electrode and electrically contacting the light emitting element.

14. The display device of claim 13, wherein the pad electrode upper layer, the first electrode, and the second electrode comprise a same material, and the pad electrode capping layer, the first connection electrode, and the second connection electrode comprise a same material.

15. The display device of claim 13, wherein the light emitting element is disposed on the first insulating layer.

16. A wiring substrate comprising:

a plurality of conductive layers disposed on a substrate and comprising a wiring and a conductive pattern; and at least one insulating layer disposed between adjacent ones of the plurality of conductive layers, wherein at least one of the plurality of conductive layers comprises:

a first metal layer;

a second metal layer disposed on the first metal layer; and a third metal layer disposed on the second metal layer, the second metal layer comprises pure copper (Cu), the third metal layer comprises a copper alloy, and a grain size of the third metal layer is smaller than a grain size of the second metal layer.

17. The wiring substrate of claim 16, wherein the first metal layer comprises titanium (Ti), and the third metal layer comprises:

a main component comprising copper; and an impurity metal comprising at least one of silver (Ag), magnesium (Mg), aluminum (Al), indium (In), niobium (Nb), and boron (B).

18. The wiring substrate of claim 16, wherein the grain size of the third metal layer is a quarter or less of the grain size of the second metal layer.

19. The wiring substrate of claim 16, wherein the first metal layer has a thickness in a range of about 200 Å to about 500 Å, the second metal layer has a thickness in a range of about 3000 Å to about 17000 Å, and the third metal layer has a thickness of about 100 Å or more.

20. The wiring substrate of claim 16, wherein each of the wiring and the conductive pattern comprises the first metal layer, the second metal layer, and the third metal layer, and a line edge roughness (LER) value of each of the wiring and the conductive pattern is about 0.195 μm or less.

21. The wiring substrate of claim 16, further comprising:

a display area and a pad area disposed adjacent to the display area, wherein the plurality of conductive layers comprise:

a first conductive layer comprising a bottom metal layer disposed in the display area and a first pad wiring disposed in the pad area;

a second conductive layer disposed on the first conductive layer and comprising a plurality of gate electrodes disposed in the display area and a second pad wiring disposed in the pad area; and a third conductive layer disposed on the second conductive layer and comprising a first conductive pattern disposed in the display area and a pad electrode lower layer disposed in the pad area.

22. The wiring substrate of claim 21, further comprising:

a buffer layer disposed on the first conductive layer;

a gate insulating layer disposed between the buffer layer and the second conductive layer in the display area;

an interlayer insulating layer disposed between the second conductive layer and the third conductive layer; and a first passivation layer disposed on the third conductive layer, wherein each of the gate insulating layer, the interlayer insulating layer, and the first passivation layer comprises an inorganic insulating material, and the second pad wiring is directly disposed on the buffer layer.

* * * * *